United States Patent
May

(10) Patent No.: US 7,599,451 B2
(45) Date of Patent: Oct. 6, 2009

(54) SAMPLE RATE CONVERSION MODULE AND APPLICATIONS THEREOF

(75) Inventor: Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 603 days.

(21) Appl. No.: 11/126,832

(22) Filed: May 11, 2005

(65) Prior Publication Data

US 2006/0274858 A1 Dec. 7, 2006

(51) Int. Cl.
H04L 27/06 (2006.01)
H03M 7/00 (2006.01)

(52) U.S. Cl. ......................................... 375/340; 341/61

(58) Field of Classification Search ................. 375/340, 375/354, 355; 341/110, 162, 50, 61
See application file for complete search history.

(56) References Cited

U.S. PATENT DOCUMENTS

| | | | |
|---|---|---|---|
| 5,225,787 A * | 7/1993 | Therssen | 327/113 |
| 5,239,585 A | 8/1993 | Restle | |
| 5,335,194 A * | 8/1994 | Clayton et al. | 708/313 |
| 5,497,152 A * | 3/1996 | Wilson et al. | 341/61 |
| 5,892,468 A * | 4/1999 | Wilson et al. | 341/61 |
| 5,982,305 A * | 11/1999 | Taylor | 341/61 |
| 6,084,916 A * | 7/2000 | Ott | 375/259 |
| 6,208,671 B1 | 3/2001 | Paulos et al. | |
| 6,389,078 B1 | 5/2002 | Hessel et al. | |
| 6,747,858 B1 | 6/2004 | Sculley et al. | |
| 7,161,989 B1 * | 1/2007 | Isaksen et al. | 375/295 |
| 2002/0181572 A1 * | 12/2002 | Meehan et al. | 375/229 |
| 2002/0181576 A1 * | 12/2002 | Kennedy et al. | 375/233 |
| 2005/0070325 A1 * | 3/2005 | Bellaouar et al. | 455/550.1 |
| 2006/0256809 A1 * | 11/2006 | May | 370/465 |

OTHER PUBLICATIONS

TEA5767HN "Low-Power FM Stereo Radio for Handheld Applications" by Philips Semiconductors, Sep. 20, 2004.
"A" 10.7-MHz IF-to-Baseband Sigma-Delta A/D Conversion System for AM/FM Radio Receivers by Eric Van Der Zwan, et al IEEE Journal of Solid State Circuits, vol. 35, No. 12, Dec. 2000.
"A Fully Integrated Hgh-Performance FM Stereo Decoder" by Gregory J. Manlove et al, IEEE Journal of Solid State Circuits, vol. 27, No. 3, Mar. 1992.
"A 5-MHz IF Digital FM Demodulator", by Jaejin Park, et al, IEEE Journal of Solid State Circuits, vol. 34, No. 1, Jan. 1999.

(Continued)

*Primary Examiner*—Khanh C Tran
(74) *Attorney, Agent, or Firm*—Toler Law Group

(57) ABSTRACT

A sample rate converter includes an upsampling module, a low pass filter, and a linear sample rate conversion module. The upsampling module is operably coupled up-sample a digital input signal having a first rate to produce a digitally up-sampled signal. The low pass filter is operably coupled to low pass filter the digitally up-sampled signal to produce a digitally filtered signal at an up-sampled rate. The linear sample rate conversion module is operably coupled to convert the digitally up-sampled signal into a sample rate adjusted digital signal having a second rate based on an control feedback signal and a linear function, wherein a relationship between the first rate and the second rate is a non-power of two.

18 Claims, 19 Drawing Sheets radio signal decoder 90

OTHER PUBLICATIONS

"A Discrete-Time Bluetooth Receiver in a 0.13pm Digital CMOS Process", by K. Muhammad et al, ISSCC2004/Session15/Wireless Consumer ICs/15.1, 2004 IEEE International Solid-State Circuit Conference.

Examination Report Under Section 18(3), U.K. Application No. GB0524078.3, United Kingdom Intellectual Property Office, Feb. 26, 2009 (2 pgs.).

Ifeachor et al., Digital Signal Processing: A Practical Approach, Addison-Wesley Publishers Ltd. 1993, (5 pgs.).

Gonzalez et al, Digital Image Processing, Prentice-Hall, Inc., 2002, (3 pgs).

Industrial Technical Prospect Training Project, Industrial Development Bureau of Ministry of Economic Affairs, (1996), (4 pgs).

Search Report for Patent Application, ROC (Taiwan) Patent Application No. 094141929, Nov. 22, 2008, (2 pgs).

* cited by examiner handheld audio system 10 handheld audio system 40 handheld audio system 50

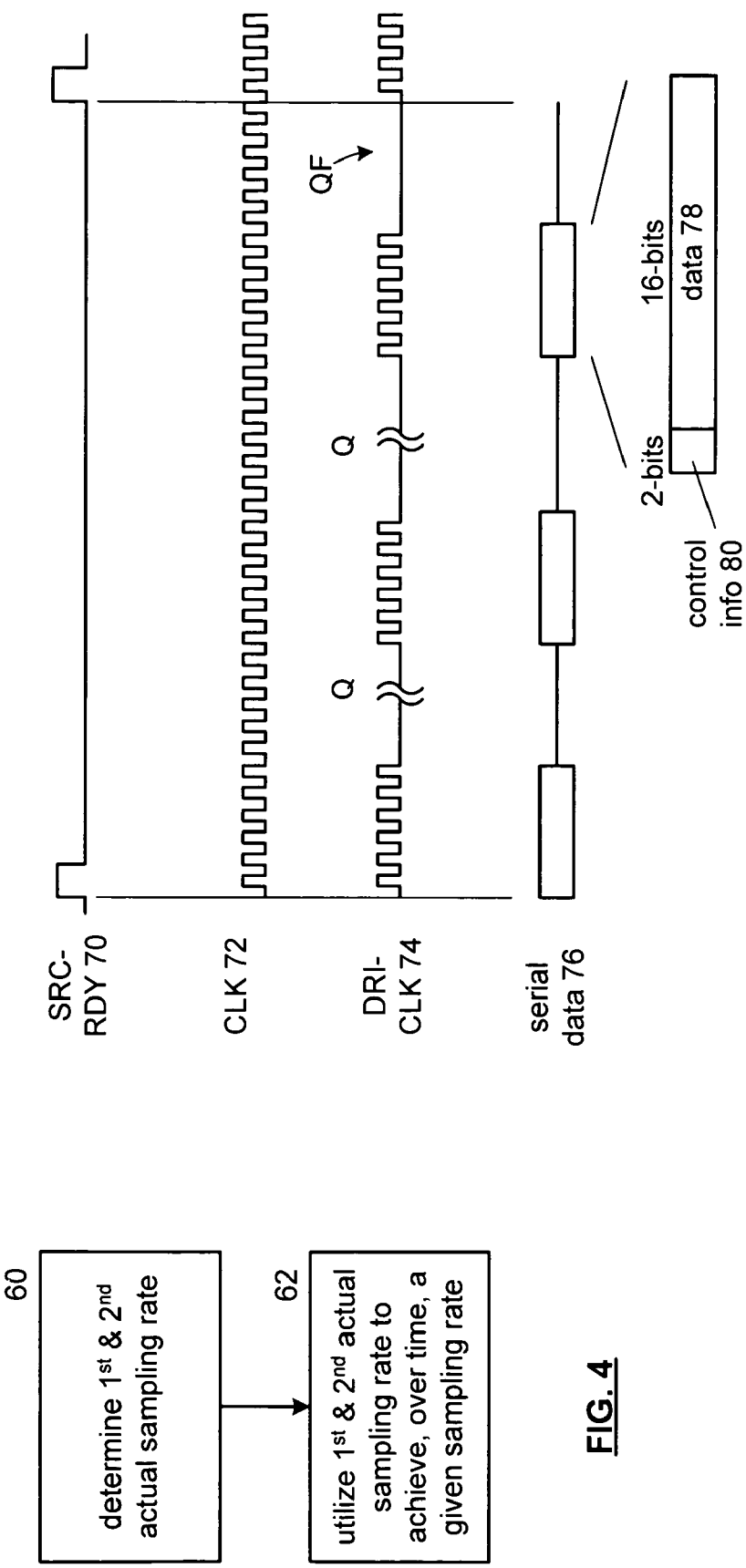

radio signal decoder IC 12 radio signal decoder IC 12 radio signal decoder 90 digital radio composite signal 158 error sensing module 144 feedback module 176 decoder 210 decoder 220 digital decoder 230 example of error correction sample rate conversion module 138 sample rate converter 270 example of SRC, demodulation & error sensing example (cont.)

example (cont.)

example (cont.)

SAMPLE RATE CONVERSION MODULE AND APPLICATIONS THEREOF

BACKGROUND OF THE INVENTION

1. Technical Field of the Invention

This invention relates generally to portable handheld digital audio systems and more particularly to integrated circuits comprising a handheld audio system.

2. Description of Related Art

As is known, handheld digital audio systems are becoming very popular. Such systems include digital audio players/recorders that record and subsequently playback MP3 files, WMA files, etc. Such digital audio players/recorders may also be used as digital dictaphones and file transfer devices. Further expansion of digital audio players/recorders includes providing a frequency modulation (FM) radio receiver such that the device offers FM radio reception.

While digital audio players/recorders are increasing their feature sets, the increase in feature sets has been done in a less than optimal manner. For instance, with the inclusion of an FM receiver in a digital audio player/recorder, the FM receiver is a separate integrated circuit from the digital audio player/recorder chip set, or IC. As such, the FM receiver integrated circuit (IC) functions completely independently of the digital audio player/recorder IC, even though both ICs include some common functionality.

Further, FM receivers function to convert a radio frequency signal into a complex baseband signal that is decoded, or demodulated, to produce a decoded baseband signal. A channel separation function splits the decoded baseband signal into a left channel signal and a right channel signal. As with any integrated circuit implemented using CMOS (complimentary metal oxide semiconductor) technology, errors in timing, signal recapture, crystal frequency variations, and variations from part to part occur. To account for such errors, FM receivers include error correcting circuit to adjust the decoded baseband signal once it is produced. While this technical reduces the above described adverse affects, it requires a fairly complex circuit implementation and addresses the problem in a passive cause and affect manner.

Four papers teach FM receivers that address at least one of the above mentioned issues. The four papers include, "A 10.7-MHz IF-to-Baseband Sigma-Delta A/D Conversion System for AM/FM Radio Receivers" by Eric Van Der Zwan, et. al. IEEE Journal of Solid State Circuits, VOL. 35, No. 12, December 2000; "A fully Integrated High-Performance FM Stereo Decoder" by Gregory J. Manlove et. al, IEEE Journal of Solid State Circuits, VOL. 27, No. 3, March 1992; "A 5-MHz IF Digital FM Demodulator", by Jaejin Park et. al, IEEE Journal of Solid State Circuits, VOL. 34, No. 1, January 1999; and "A Discrete-Time Bluetooth Receiver in a 0.13 μm Digital CMOS Process", by K. Muhammad et. al, ISSCC2004/Session 15/Wireless Consumer ICs/15.1, 2004 IEEE International Solid-State Circuit Conference.

Therefore, a need exists for a method and apparatus for radio decoding that is optimized to function with a digital audio player/recorder and includes sample rate conversion.

BRIEF SUMMARY OF THE INVENTION

The sample rate conversion module and applications thereof of the present invention substantially meet these needs and others. In one embodiment, a sample rate converter includes an upsampling module, a low pass filter, and a linear sample rate conversion module. The upsampling module is operably coupled to up-sample a digital input signal having a first rate to produce a digitally up-sampled signal. The low pass filter is operably coupled to low pass filter the digitally up-sampled signal to produce a digitally filtered signal at an up-sampled rate. The linear sample rate conversion module is operably coupled to convert the digitally up-sampled signal into a sample rate adjusted digital signal having a second rate based on a control feedback signal and a linear function, wherein a relationship between the first rate and the second rate is a non-power of two.

In another embodiment, a sample rate converter includes a sampling module, a determining module, and an outputting module. The sampling module is operably coupled to sample, at a sampling rate, an input signal to produce a digital sampled signal at the sampling rate. The determining module is operably coupled to determine whether, for a given sample of an interpolated digital signal at a second rate, a sample of the digital sampled signal has an error term within a first value range, wherein the second rate is less than the sampling rate and a relationship between the sampling rate and the second rate is a non-power of two. The outputting module is operably coupled to pass the sample of the digital sampled signal as the given sample when the error term is within the first value range and to determine a value for the given sample based on the sample of the digital sampled signal, a previous sample of the digital sampled signal, and the error term when the error term is not within the first value range.

In yet another embodiment, a digital Frequency Modulation (FM) decoder includes a low noise amplifier, a mixing module, an analog to digital conversion module, a digital baseband conversion module, a sample rate converter, a demodulation module, a channel separation module, and an error sensing module. The low noise amplifier is operably coupled to amplify a received FM signal to produce an amplified FM signal. The mixing module is operably coupled to convert the amplified FM signal into a low intermediate frequency (IF) signal based on a local oscillation. The analog to digital conversion module is operably coupled to convert the low IF signal into a digital low IF signal. The digital baseband conversion module is operably coupled to convert the digital low IF signal into a digital baseband signal. The sample rate converter is operably coupled to adjust the digital baseband signal from a first rate to a second rate based on a feedback error signal to produce a digital FM encoded signal. The demodulation module is operably coupled to demodulate the digital FM encoded signal to produce a digital FM composite signal. The channel separation module is operably coupled to separate a left channel signal and a right channel signal from the digital FM composite signal. The error sensing module is operably coupled to produce the feedback error signal based on the digital FM composite signal.

BRIEF DESCRIPTION OF THE SEVERAL VIEWS OF THE DRAWINGS

FIG. 4 is a logic diagram of a method performed by a digital radio interface in accordance with the present invention;

FIG. 5 is a timing diagram illustrating the interconnectivity of a radio signal decoder and digital audio processing integrated circuit in accordance with the present invention;

DETAILED DESCRIPTION OF THE DRAWINGS

Figure 1:
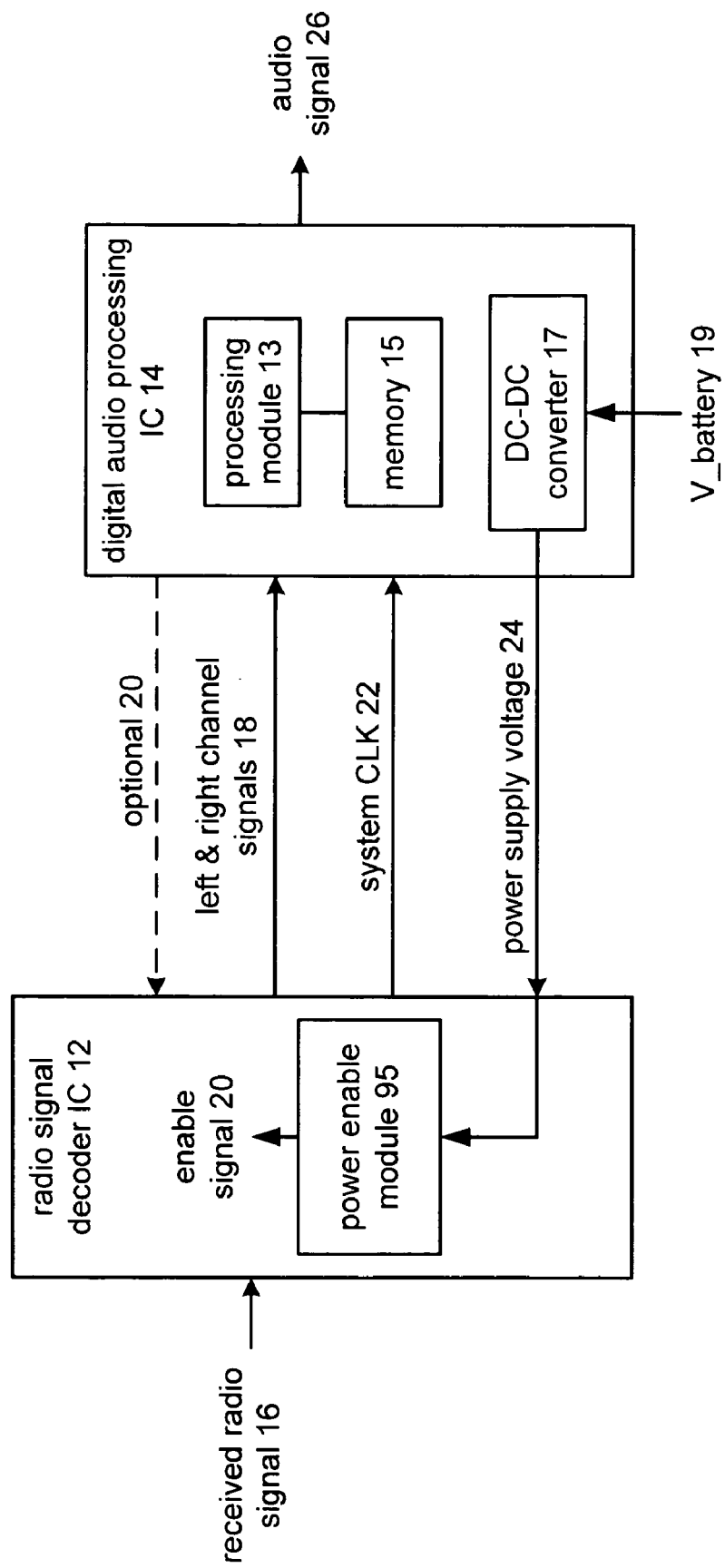
FIG. 1 is a schematic block diagram of a handheld audio system in accordance with the present invention.

FIG. 1 is a schematic block diagram of a handheld audio system 10 that includes a radio signal decoder integrated circuit 12 and a digital audio processing integrated circuit 14. The digital audio processing integrated circuit 14 includes a processing module 13, memory 15, and a DC-to-DC converter 17. The processing module 13 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 15 may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module 13 implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory 15 stores, and the processing module 13 executes, operational instructions corresponding to at least some of the steps and/or functions illustrated in FIGS. 1-19.

In an embodiment, when a battery (e.g., V_battery 19), or other external power source, is initially applied to the radio signal decoder 12, which will be described in greater detail with reference to FIGS. 3-19, and the digital audio processing IC 14, the DC-DC converter 17 generates a power supply voltage 24 based on an internal oscillation. When the power supply voltage 24 reaches a desired value (e.g., near a regulated value), the processing module 13 provides an enable signal 20 (which is labeled as optional 20) to the radio signal decoder IC 12. In response to the enable signal 20, the radio signal decoder IC 12 generates the system clock 22; with the remaining functionality of the radio signal decoder 12 being inactive awaiting a second enable signal or being activated once the system clock 22 is functioning. The radio signal decoder 12 provides the system clock 22 to the audio processing integrated circuit 14. Upon receiving the system clock 22, the DC-DC converter may switch from the internal oscillation to the system clock 22 to produce the power supply voltage 24 from the battery voltage 19, or external power source. Note that when the radio signal decoder 12 is powered via the battery (V_battery 19), it may produce a real time clock (RTC) in addition to producing the system clock 22.

In another embodiment, when the battery is initially applied to the digital audio processing IC 14 and the DC-DC converter is enabled, the DC-DC converter generates a power supply voltage 24. The DC-DC converter 17 provides the power supply voltage 24 to circuit modules within the digital audio processing IC 14 and to the radio signal decoder IC 12. A power enable module 95 monitors to the power supply voltage 24 and when it reaches a desired value (e.g., at or near a steady state value), the power enable module 95 generates the enable signal 20. The radio signal decoder IC 12 generally responds to the enable signal 20 as discussed in the previous paragraph.

With the system clock 22 functioning, the radio signal decoder IC 12 converts a received radio signal 16 into left and right channel signals 18, which may be analog or digital signals. In one embodiment, the left and right channel signals 18 include a Left+Right signal and a Left−Right signal. The radio signal decoding IC 12 provides the left and right channel signals 18 to the digital audio processing IC 14.

The digital audio processing integrated circuit 14, which may be a digital audio player/recorder integrated circuit such as the STMP35XX and/or the STMP36XX digital audio processing system integrated circuits manufactured and distributed by Sigmatel Incorporated, receives the left and right channel signals 18 and produces therefrom audio signals 26. The digital audio processing IC 14 may provide the audio signals 26 to a headphone set or other type of speaker output. As an alternative to producing the audio signals 26 from the left and right channel signals 18, the digital audio processing integrated circuit 14 process stored MP3 files, stored WMA files, and/or other stored digital audio files to produce the audio signals 26.

Figure 2:
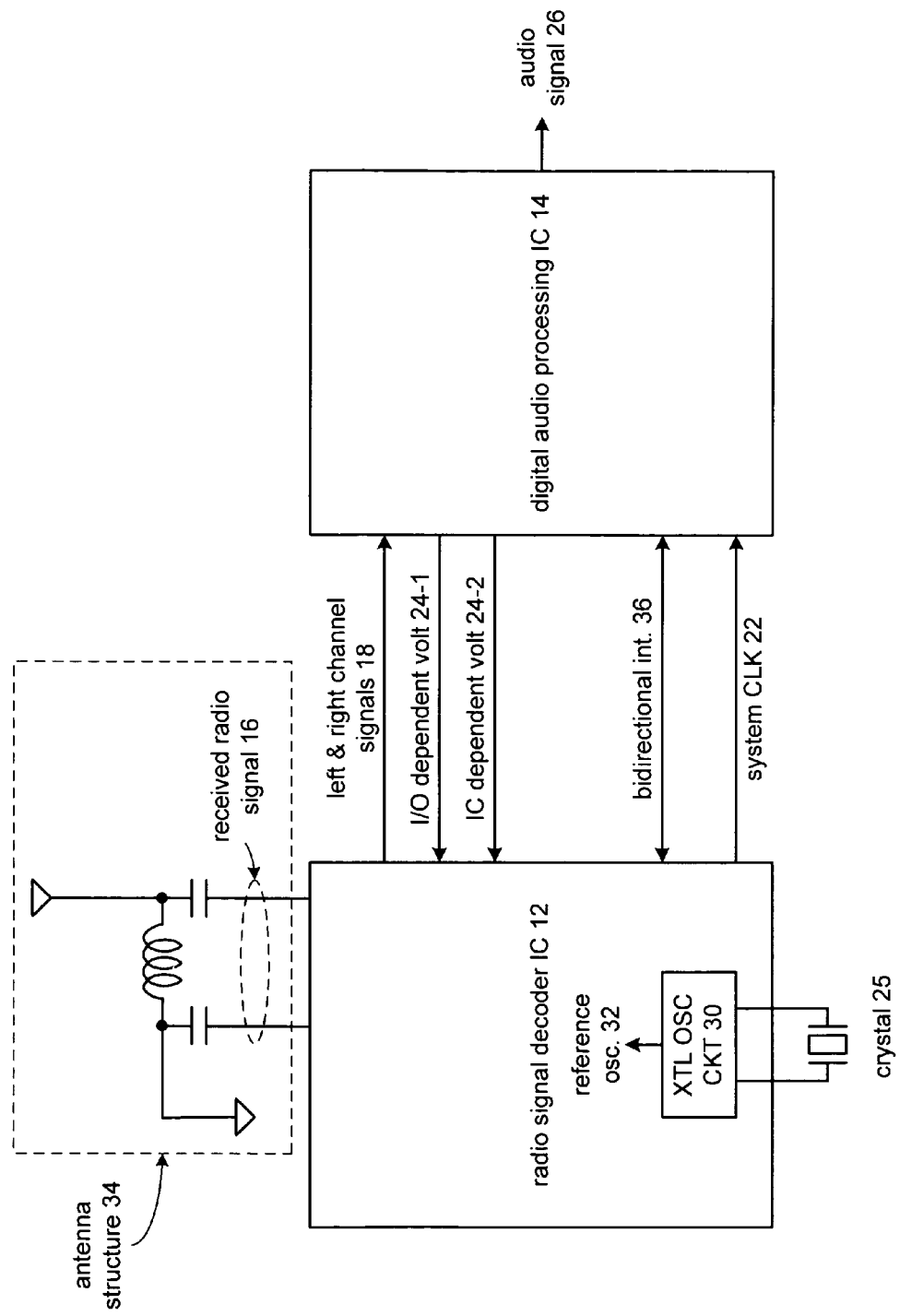
FIG. 2 is a schematic block diagram of another embodiment of a handheld audio system in accordance with the present invention.

FIG. 2 is a schematic block diagram of another handheld audio system 40 that includes the radio signal decoder integrated circuit 12 and the digital audio processing integrated circuit 14. In this embodiment, the radio signal decoder integrated circuit 12 includes an antenna structure 34 and a crystal oscillator circuit 30, which is operably coupled to a crystal 25 (e.g., a 24 MHz crystal). The crystal oscillation circuit 30 is operably coupled to produce a reference oscillation 32 from the crystal 25. The radio signal decoder integrated circuit 12, which may include one or more phase locked loops, converts the reference oscillation 32 into an oscillation from which the system clock 22 is derived. For example, the system clock 22 may be the output oscillation of a phase locked loop, an oscillation that is a multiple or fraction of the output oscillation of the phase locked loop.

The antenna structure 34 includes an antenna, a plurality of capacitors, and an inductor coupled as shown. The receive radio signal 16 is provided from the antenna structure 34 to the radio signal decoder integrated circuit 12. As with the embodiment of FIG. 1, the radio signal decoder integrated circuit 12 converts the receive radio signal 16 into left and right channel signals 18.

The digital audio processing integrated circuit 14, via the DC-DC converter 17, generates an input/output (I/O) dependent supply voltage 24-1 and an integrated circuit (IC) dependent voltage 24-2 that are supplied to the radio signal decoder IC 12. In one embodiment, the I/O dependent voltage 24-1 is dependent on the supply voltage required for input/output interfacing of the radio signal decoder IC and/or the digital audio processing IC 14 (e.g., 3.3 volts) and the IC dependent voltage 24-2 is dependent on the IC process technology used to produce integrated circuits 12 and 14. In an embodiment, the integrated circuit process technology is 0.08 to 0.35 micron CMOS technology where the IC dependent voltage 24-2 is 1.8 volts or less.

The interface between the integrated circuits 12 and 14 further includes a bi-directional interface 36. Such an interface may be a serial interface for the integrated circuits 12 and 14 to exchange control data and/or other type of data, including the enable signal 20. In one embodiment, the bi-directional interface 36 may be one or more serial communication paths that are in accordance with the I²C serial transmission protocol. As one or ordinary skill in the art will appreciate, other serial transmission protocols may be used for the bi-directional interface 36 and the bi-directional interface 36 may include one or more serial transmission paths.

Figure 3:
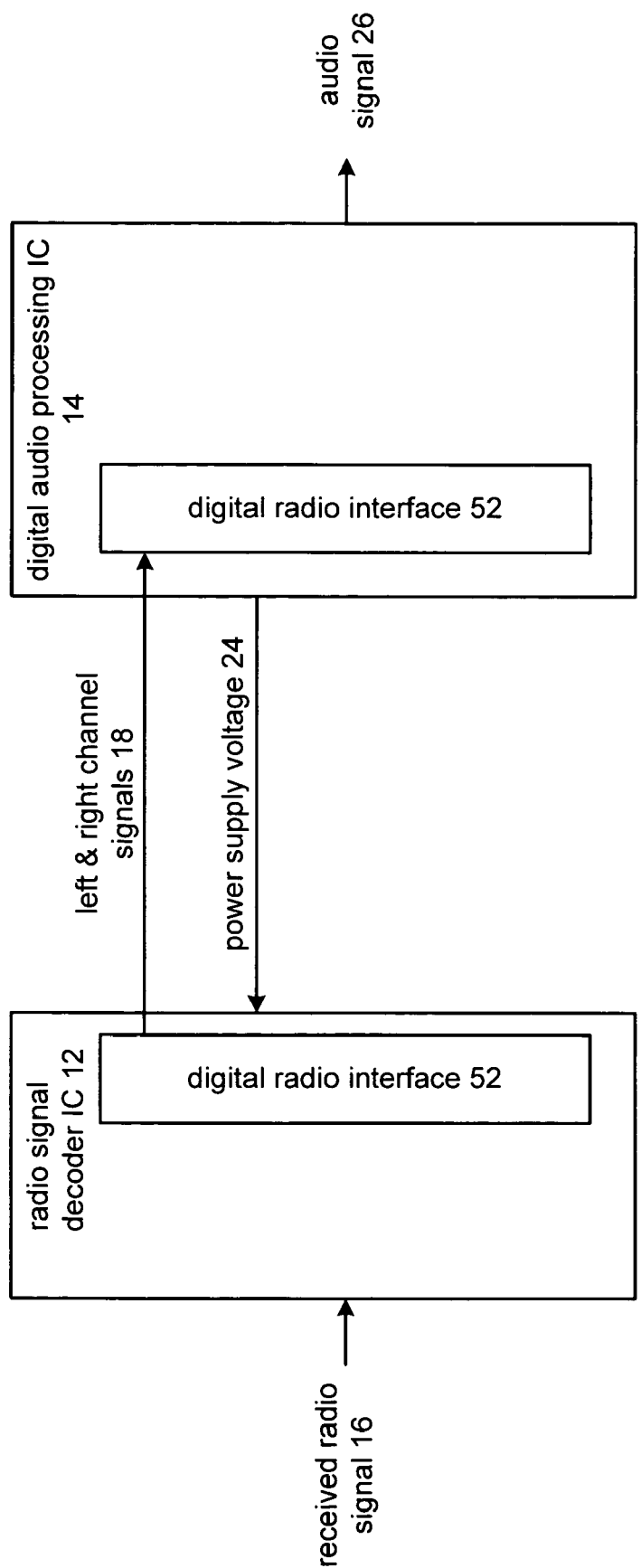
FIG. 3 is a schematic block diagram of yet another embodiment of a handheld audio system in accordance with the present invention.

FIG. 3 is a schematic block diagram of yet another embodiment of the handheld audio system 50 that includes the radio signal decoder integrated circuit 12 and the digital audio processing integrated circuit 14. In this embodiment, each of the radio signal decoder integrated circuit 12 and the digital audio processing IC 14 includes a digital radio interface 52. The digital radio interface 52 is operably coupled to provide the left and right channel signals 18 from the radio signal decoding IC 12 to the digital audio processing integrated circuit 14. Within the radio signal decoder IC 12, the digital radio interface 52 converts parallel left and right channel signals 18 into a serial signal and, within the digital audio processing integrated circuit 14, the digital radio interface 52 converts the serial left and right channel signals 18 back into parallel signals. Note that the serial to parallel and parallel to serial functionality of the digital radio interface 52 may be programmable based on the sample rate of the radio signal decoder integrated circuit 12, a desired data rate, or other parameters of the ICs 12 and 14.

In general, the digital radio interface 52 is a custom interface for connecting the digital audio processing integrated circuit 14 to the radio signal decoder IC 12. Such a digital radio interface 52 may generate a data clock of 4 MHz or 6 MHz, or some other rate, to support the conveyance of serial data between the ICs 12 and 14. In addition, the digital radio interface 52 formats the serial data into a packet, or frame, that includes one to five data words having a sampling rate based on the sample rate conversion of the radio signal decoder IC 12, which will be described in greater detail with reference to FIGS. 8-19. Nominally, a packet, or frame, will include four 18-bit words having a sampling rate of at 44.1 KHz per word, 2 of the 18 bits are for control information and the remaining 16 bits are for data.

The digital radio interface 52 may convey more that the left and right channel signals 18, which may be in the form of Left+Right channel signals and Left-Right channel signals. For instance, the digital radio interface 52 may convey receive signal strength indications, data clock rates, control information, functionality enable/disable signals, functionality regulation and/or control signals, and radio data service signals between the ICs 12 and 14.

FIG. 4 is a logic diagram of the functionality of the digital radio interface 52. In this embodiment, the digital radio interface 52 determines the first and second actual sampling rates of a signal to be conveyed to the digital audio processing integrated circuit (Step 60). At Step 62, the digital radio interface utilizes the first and second actual sampling rates to achieve, over time, a given sampling rate that corresponds to the desired output sampling rate.

FIG. 5 illustrates a timing diagram of data transmission via the serial interconnection between the digital radio interfaces of integrated circuits 12 and 14. As shown, a sample rate conversion ready signal (SRC_RDY) 70 is periodically activated. Clock signal 72 corresponds to the data clock that is derived from the system clock 22. The rate for clock 72 may range from a few megahertz to tens of megahertz and beyond.

From the SRC_RDY signal 70 and clock 72 the digital radio interface generates a DRI_clock 74. The DRI_clock 74 includes a clocking portion, which has a frequency corresponding to clock 72, and a plurality of quiet periods (Q). The last quiet period between sample rate ready signals pulses is designated as the final quiet period (QF). The quiet periods correspond to a rate of the data ready, or sample rate conversion ready signal 70, and the rate of clock signal 72.

Serial data 76 is transmitted between the integrated circuits 12 and 14 in accordance with the DRI_clock 74. During the quiet periods (Q), no data is transmitted. As such, serial data 76 is only transmitted when the DRI_clock 74 is active. The serial data 76 includes one or more words (e.g., 1-5 words), where each word includes 18 bits, 2 of which are used for control information 80 and the remaining 16 bits are for data 78. The formatting of the serial data may be in accordance with one or more serial data transmission protocols (e.g., I²C).

Figure 6:
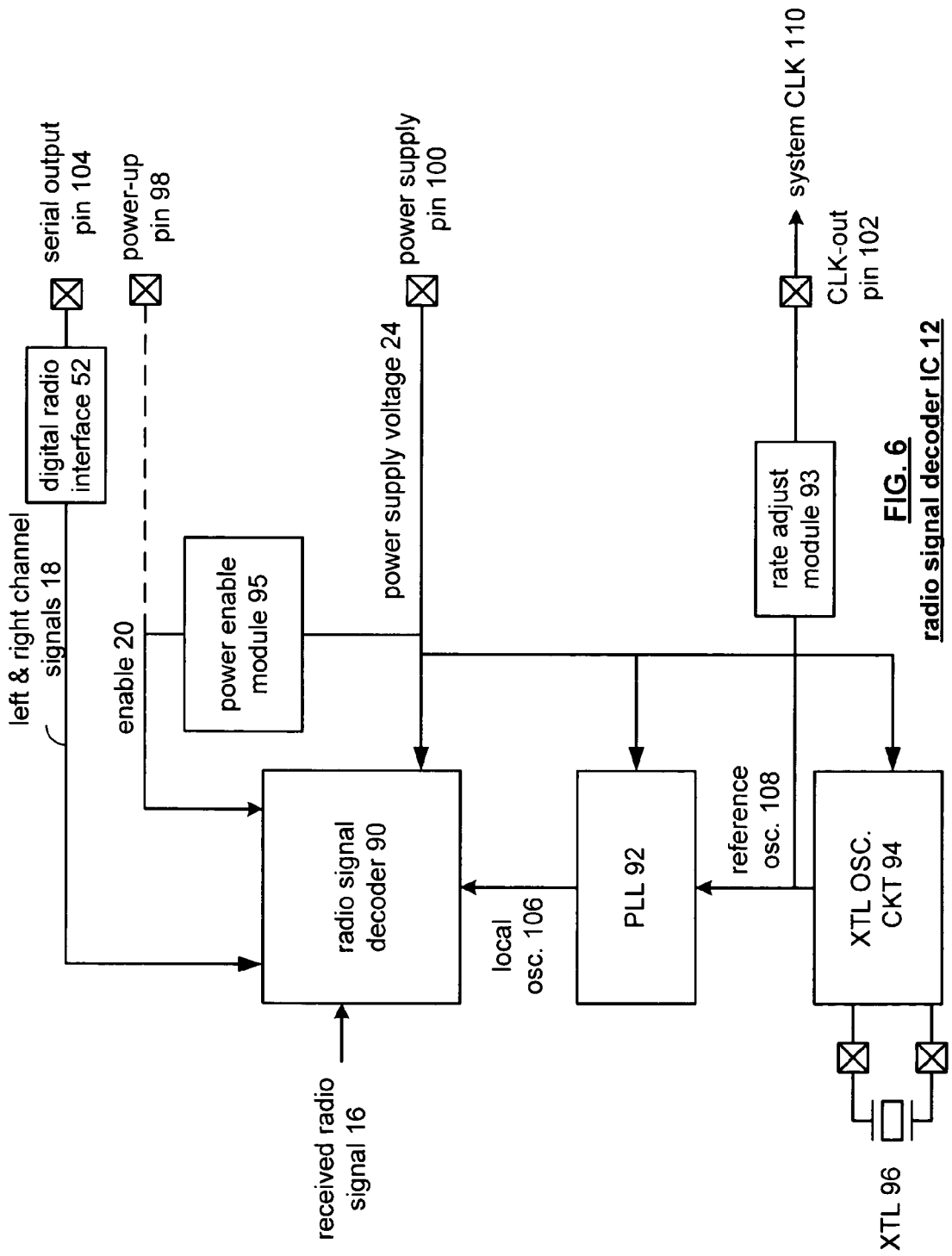
FIG. 6 is a schematic block diagram of a radio signal decoder integrated circuit in accordance with the present invention.

FIG. 6 is a schematic block diagram of an embodiment of the radio signal decoder integrated circuit 12 that includes the digital radio interface 52, a crystal oscillation circuit (XTL OSC CKT) 94, a phase locked loop (PLL) 92, the power enable module 95, and a radio signal decoder 90. The crystal oscillation circuit 94 is operably coupled, via integrated circuit pins, to an external crystal 96 to produce a reference oscillation 108. The rate of the reference oscillation 108 is based on the properties of the external crystal 96 and, as such, may range from a few mega-Hertz to hundreds of kilo-Hertz. In an embodiment, the reference oscillation 108 produces the system output clock 110, which is outputted via a clock output (CLK_out) pin 102. As one of ordinary skill in the art will appreciate, the system clock 110 may be identical to the reference oscillation 108, may have a rate that is a multiple of reference oscillation 108 via the rate adjust module 93, may have a rate that is a fraction of reference oscillation 108 via the rate adjust module 93, may have a phase shift with respect to the reference oscillation, or a combination thereof.

The phase locked loop 92 also produces a local oscillation 106 from the reference oscillation 108. The rate of the local oscillation corresponds to a difference between an intermediate frequency (IF) and a carrier frequency of the received radio signal 16. For instance, if the desired IF is 2 MHz and the carrier frequency of the received radio signal 16 is 101.5 MHz, the local oscillation is 99.5 MHz (i.e., 101.5 MHz–2 MHz). As one of ordinary skill in the art will appreciate, the intermediate frequency (IF) may range from DC to a few tens of MHz and the carrier frequency of the received radio signal 16 is dependent upon the particular type of radio signal (e.g., AM, FM, satellite, cable, etc.). As one of ordinary skill in the art will further appreciate, the radio signal decoder 90 may process a high side carrier or a low side carrier of the RF signals and/or IF signals.

The radio signal decoder 90 converts the received radio signal 16, which may be an AM radio signal, FM radio signal, satellite radio signal, cable radio signal, into the left and right channel signals 18 in accordance with the local oscillation 106. The radio signal decoder 90, which will be described in greater detail with reference to FIGS. 8-19, provides the left and right channel signals to the digital radio interface 52 for outputting via a serial output pin 104. The serial output pin 104 may includes one or more serial input/output connections. As is further shown, the radio signal decoder 90 may receive the enable signal 20 via a power-up pin 98 and a power supply voltage from power supply pin 100. Alternatively, the power enable module 95 generates the enable signal 20 when the power supply 24 reaches a desired value. In this instance, IC pin 98 may be used for another function.

Figure 7:
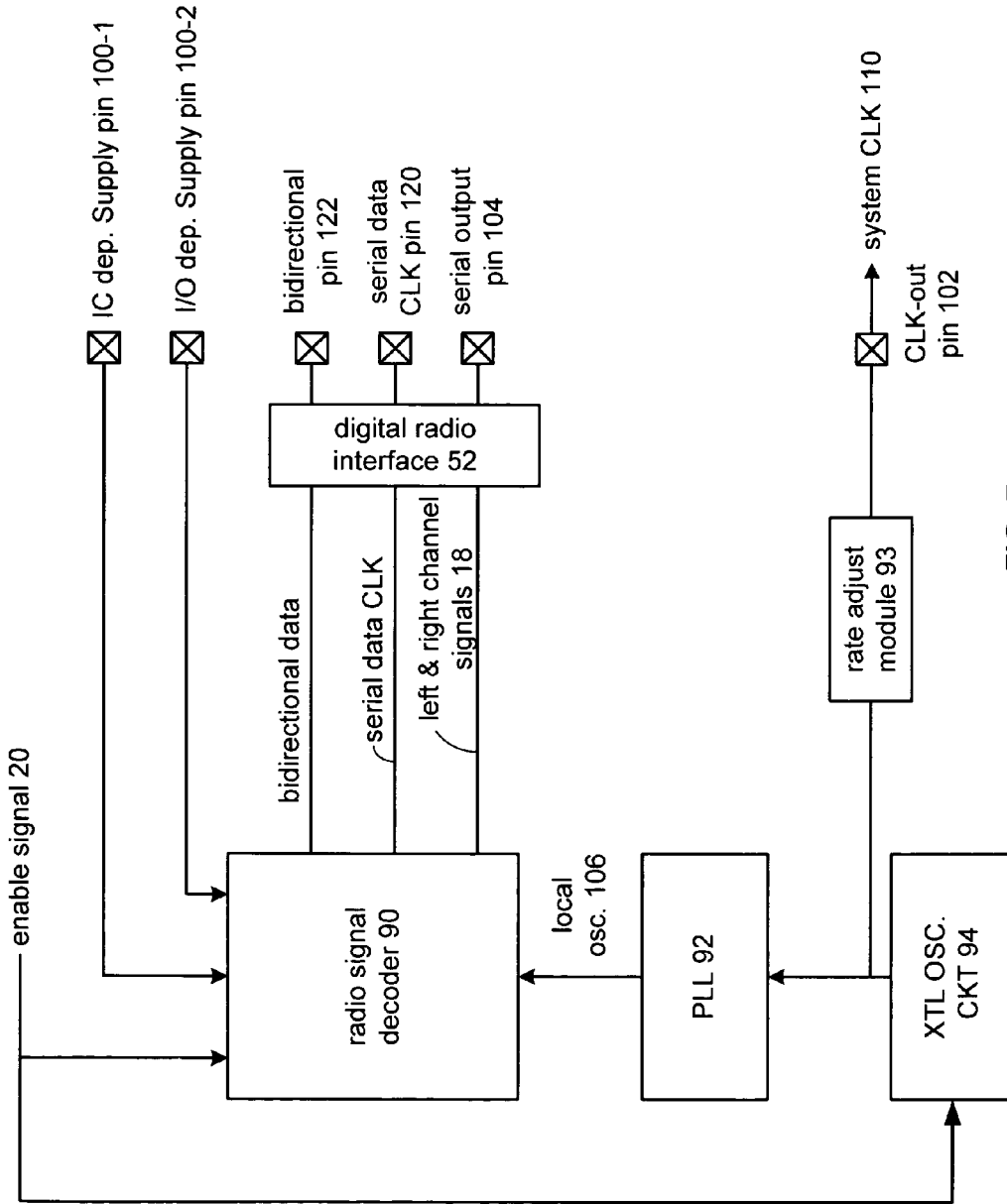
FIG. 7 is a schematic block diagram of another embodiment of a radio signal decoder integrated circuit in accordance with the present invention.

FIG. 7 is a schematic block diagram of another embodiment of the radio signal decoder integrated circuit 12. In this embodiment, the integrated circuit 12 includes the digital radio interface 52, the crystal oscillation circuit 94, the phase locked loop 92, the optional rate adjust module 93, and the radio signal decoder 90. As is further shown, the integrated circuit 12 includes a plurality of integrated circuit pins: the serial output pin 104, the clock out pin 102, an IC dependent supply pin 100-1, an I/O dependent supply voltage pin 100-2, a bi-directional pin 122, and a serial data clock pin 120. The serial data clock pin 120 supports a serial data clock that is transmitted between integrated circuit 12 and integrated circuit 14 and the bi-directional pin 122 supports transmission of bi-directional data between integrated circuit 12 and integrated circuit 14.

Figure 8:
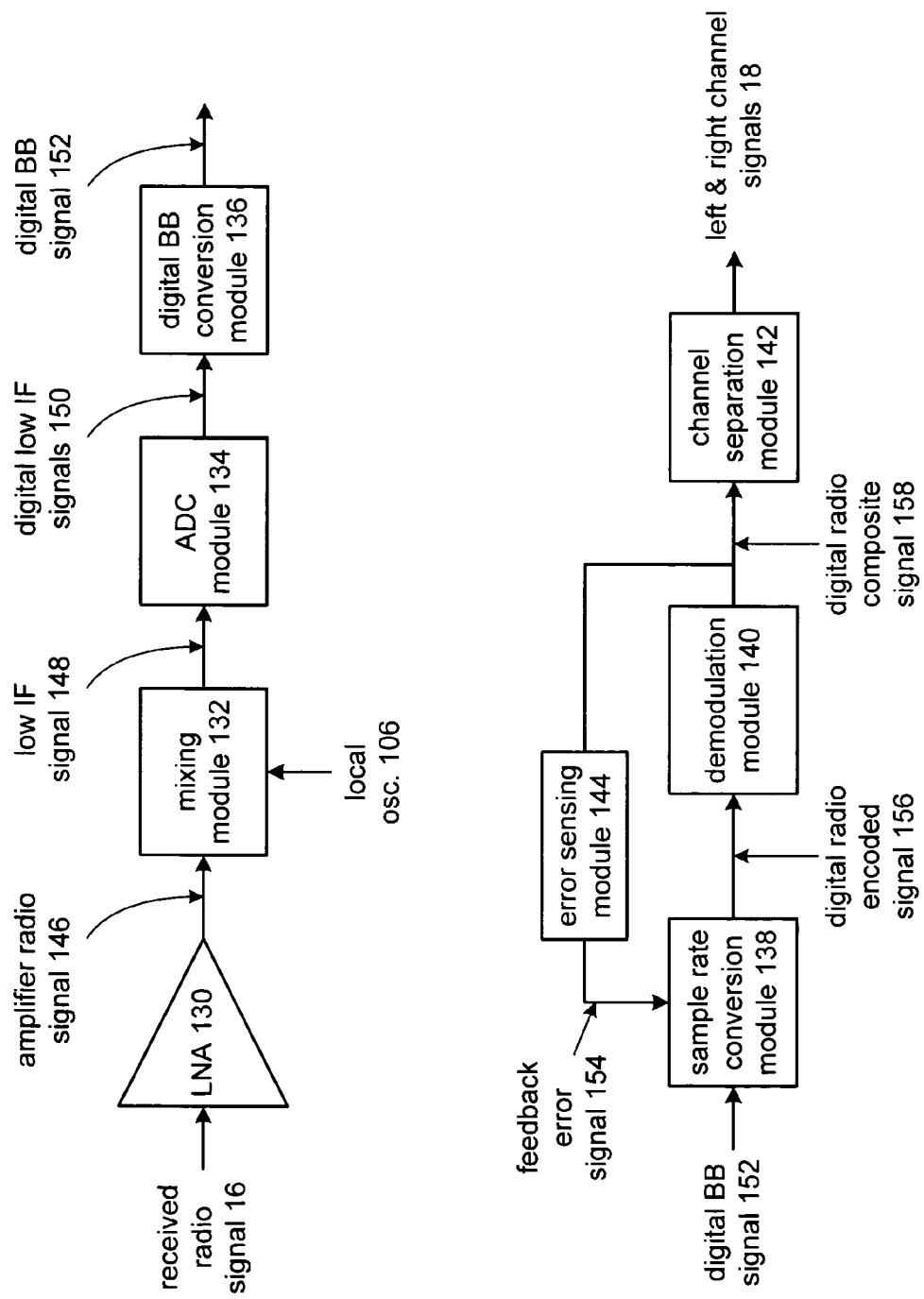
FIG. 8 is a schematic block diagram of a radio signal decoder in accordance with the present invention.

FIG. 8 is a schematic block diagram of a radio signal decoder 90 that includes a low noise amplifier (LNA) 130, a mixing module 132, an analog-to-digital conversion module 134, a digital baseband conversion module 136, a sample rate conversion module 138, a demodulation module 140, a channel separation module 142, and an error sensing module 144.

In operation, the low noise amplifier 130 receives the radio signal 16 and amplifies it to produce an amplified radio signal 146. The gain at which the low noise amplifier 130 amplifies the receive signal 16 is dependent on the magnitude of the received radio signal 16 and automatic gain control (AGC) functionality of the radio signal decoder 90. The mixing module 132 mixes the amplified radio signal 146 with the local oscillation 106 to produce a low intermediate frequency signal 148. If the local oscillation 106 has a frequency that matches the frequency of the radio signal 146 the low intermediate frequency signal 148 will have a carrier frequency of approximately zero. If the local oscillation 106 is slightly more or less than the radio signal 146, then the low intermediate frequency signal 148 will have a carrier frequency based on the difference between the frequency of the radio signal 146 and the frequency of local oscillation 106. In such a situation, the carrier frequency of the low IF signal 148 may range from 0 hertz to tens of mega-Hertz.

The analog-to-digital conversion module 134 converts the low IF signal 148 into a digital low IF signal 150. In one embodiment, the low IF signal 148 is a complex signal including an in-phase component and a quadrature component. Accordingly, the analog-to-digital conversion module 134 converts the in-phase and quadrature components of the low IF signal 148 into corresponding in-phase and quadrature digital signals 150.

The digital baseband conversion module 136 is operably coupled to convert the digital low IF signals 150 into digital baseband signals 152. Note that if the digital low IF signals 150 have a carrier frequency of zero, the digital baseband conversion module 136 primarily functions as a digital filter to produce a digital baseband signals 152. If, however, the intermediate frequency is greater than zero, the digital baseband conversion module 136 functions to convert the digital low IF signals 150 to have a carrier frequency of zero and performs digital filtering.

The sample rate conversion module 138, which will be described in greater detail with reference to FIGS. 17-19, receives the digital baseband signal 152 and a feedback error signal 154 to produce a digital radio encoded signal 156. The demodulation module 140 demodulates the digital radio encoded signal 156 to produce a digital radio composite signal 158. The error sensing module 144, which will be described in greater detail with reference to FIGS. 10-12, interprets the radio signal composite signal 158 to produce the feedback error signal 154. The channel separation module 142 is operably coupled to produce the left and right channel signals 18 from the digital radio composite signal 158.

Figure 9:
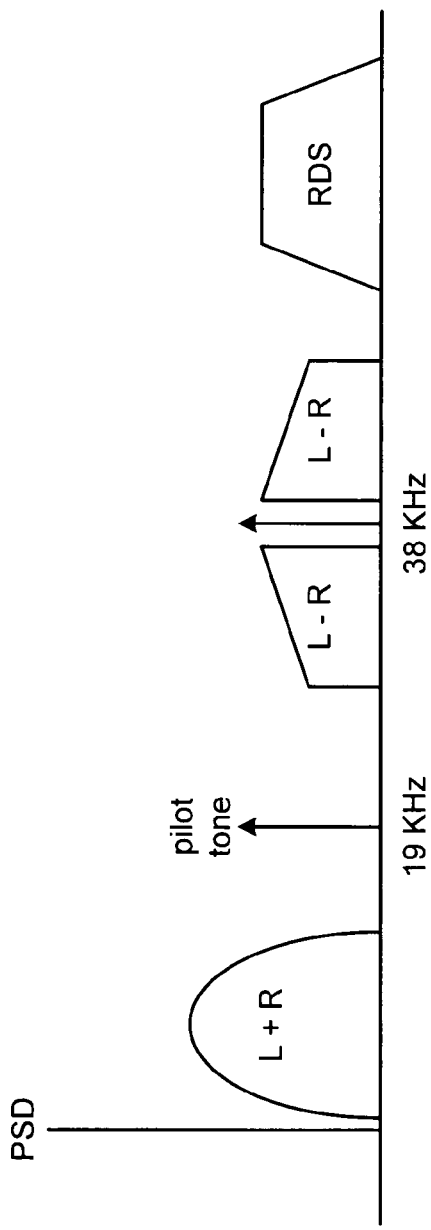
FIG. 9 is a frequency spectrum diagram of a digital radio composite signal in accordance with the present invention.

FIG. 9 is a frequency diagram of the digital radio composite signal 158. The signal includes a pilot tone at 19 KHz and another tone at 38 KHz. The signal 158 also includes a low frequency left plus right (L+R) signal component, a left minus right (L−R) signal component, and a radio data signal (RDS) signal component. The error sensing module 144 utilizes the known properties of the 19 KHz pilot tone and the corresponding properties of the actual pilot tone embedded within the digital composite radio signal 158 to determine the error feedback signal 154. In such an embodiment, the sample rate conversion module 138 removes errors due to process variation, temperature variations, et cetera from the digital baseband signals 152 prior to demodulation via the demodulation module 140. As such, the demodulation errors of prior art embodiments are avoided by correcting this signal prior to demodulation.

Figure 10:
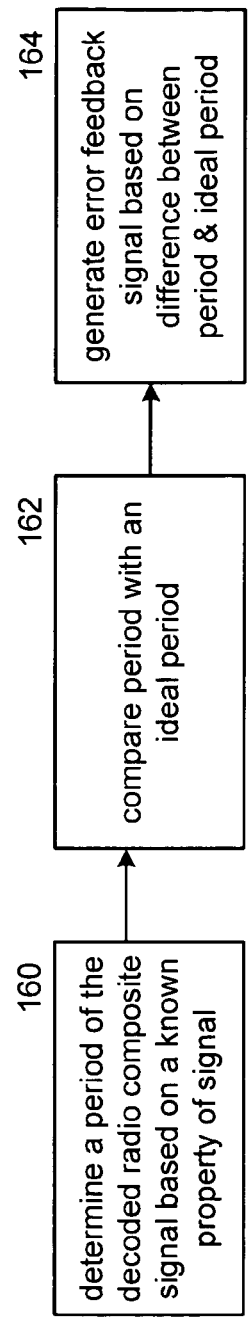
FIG. 10 is a logic diagram illustrating the functionality of an error sensing module in accordance with the present invention.

FIG. 10 is a logic diagram illustrating the functionality of the error sensing module. The processing of the error sensing module begins at Step 160 where it determines a period of the decoded radio composite signal based on a known property of the signal. For example, known property may be a pilot tone (e.g., 19 KHz or 38 KHz), a training sequence (e.g., a preamble of known tones), an auto correlation function, and/or a cross correlation function.

The processing then proceeds to Step 162 where the error sensing module compares the measured period of the decoded radio composite signal with an ideal period of the radio composite signal. For example, the error sensing module compares the measured frequency of the 19 KHz pilot tone with the known ideal period of the 19 KHz pilot tone.

The processing then proceeds to Step 164 where the error sensing module generates an error feedback signal based on a difference between the measured period and the ideal period. For example, if the actual period of the pilot tone is not within acceptable margins (e.g., +/−1% or less) of the 19.1 KHz ideal pilot tone, the error sensing module generates an error feedback signal to indicate the phase and/or frequency difference between the measured period of the pilot tone and the ideal period of the pilot tone.

Figure 11:
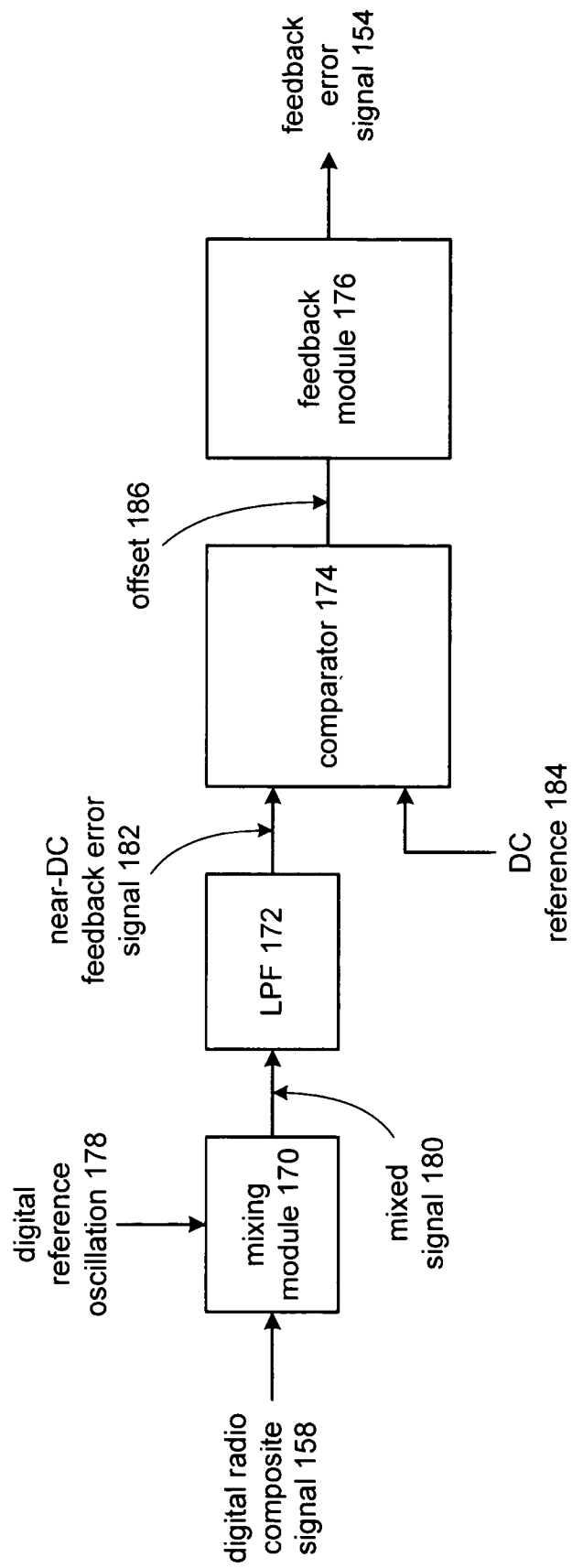
FIG. 11 is a schematic block diagram of an error sensing module in accordance with the present invention.

FIG. 11 is a schematic block diagram of an embodiment of the error sensing module 144. In this embodiment, the error sensing module 144 includes a mixing module 170, a low pass filter 172, a comparator 174 and a feedback module 176. The mixing module 170 mixes a digital reference oscillation 178 (e.g., a 19.1 KHz tone to represent the ideal pilot tone) with the digital radio composite signal 158. The mixing module 170, which may include a digital mixer, produces a mixed signal 180 (e.g., $\sin(\omega_1 t)*\sin(\omega_2 t)=\frac{1}{2}\cos(\omega_1-\omega_2)t-\frac{1}{2}\cos(\omega_1+\omega_2)t$, where $\omega_1$ represent $2\pi*f$ of the ideal pilot tone and $\omega_2$ represents $2\pi*f$ of the measured pilot tone). The low pass filter 172, which may be a multi-order cascaded integrated cone filter having a $2^n$ down sampling factor, filters the mixed signal 180 to produce a near-DC feedback error signal 182 (e.g., filters out the $-\frac{1}{2}\cos(\omega_1+\omega_2)t$ term and passes the $\frac{1}{2}\cos(\omega_1-\omega_2)t$ term).

The comparator 174 compares the near DC feedback error signal 182 with the DC reference 184 to produce an offset 186 (e.g., determines the difference between $\omega_1$ & $\omega_2$ to produce the offset). If the frequency of the composite signal 156 matches the frequency of the digital reference oscillation 178, the near DC feedback error signal 182 will have a zero frequency such that the offset 186 will be zero. If, however, the frequency of the composite signal 158 does not substantially match the frequency of the digital reference oscillation 178, the near DC feedback error signal 182 will have a non-DC frequency. The offset 186 reflects the offset of the near DC error feedback signal from DC. The feedback module 176, which will be described in greater detail with reference to FIG. 12, converts the offset 186 into the error feedback signal 154.

Figure 12:
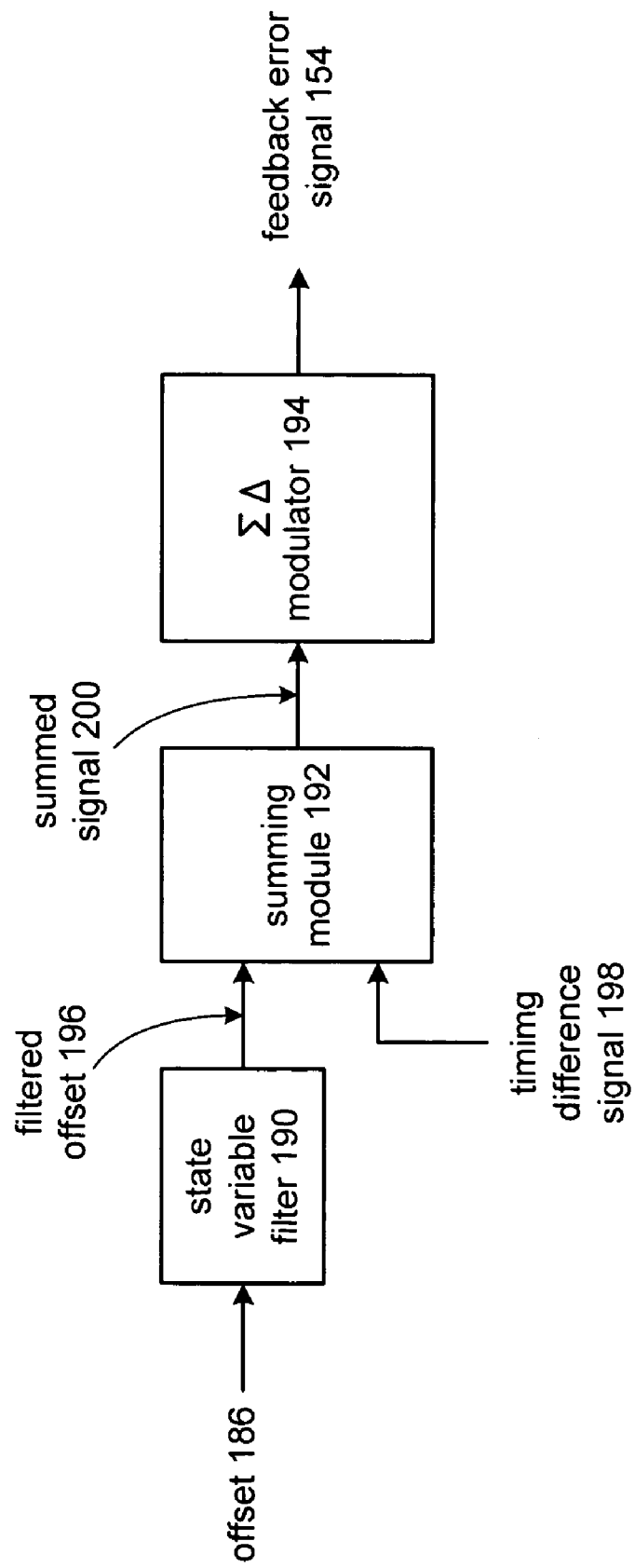
FIG. 12 is a schematic block diagram of a feedback module in accordance with the present invention.

FIG. 12 illustrates a schematic block diagram of feedback module 176 that includes a state variable filter 190, a summing module 192 and a Sigma Delta modulator 194. The state variable filter 190 filters the offset 186 to produce a filtered offset 196. The state variable filter 190 is analogous to a loop filter within a phase locked loop that includes a resistive term and a capacitive term to integrate the offset 186. In essence, the state variable filter 190 stores the offset 186 as the filtered offset 196. Note, however, that the state variable filter 190 does not set the bandwidth of the error sensing module; its primary function is to act as a low pass filter and memory to store the filtered offset 96.

The summing module 192 sums the filtered offset 196 with a timing difference signal 198 to produce a summed signal 200. The timing difference signal 198 is a known timing difference signal such that the filtered offset signal 196 represents only the unknown timing differences in the system due to such things that include process tolerance and temperature drift. The Sigma Delta modulator 194 quantizes the summed signal 200 to produce the feedback error signal 154.

Figure 13:
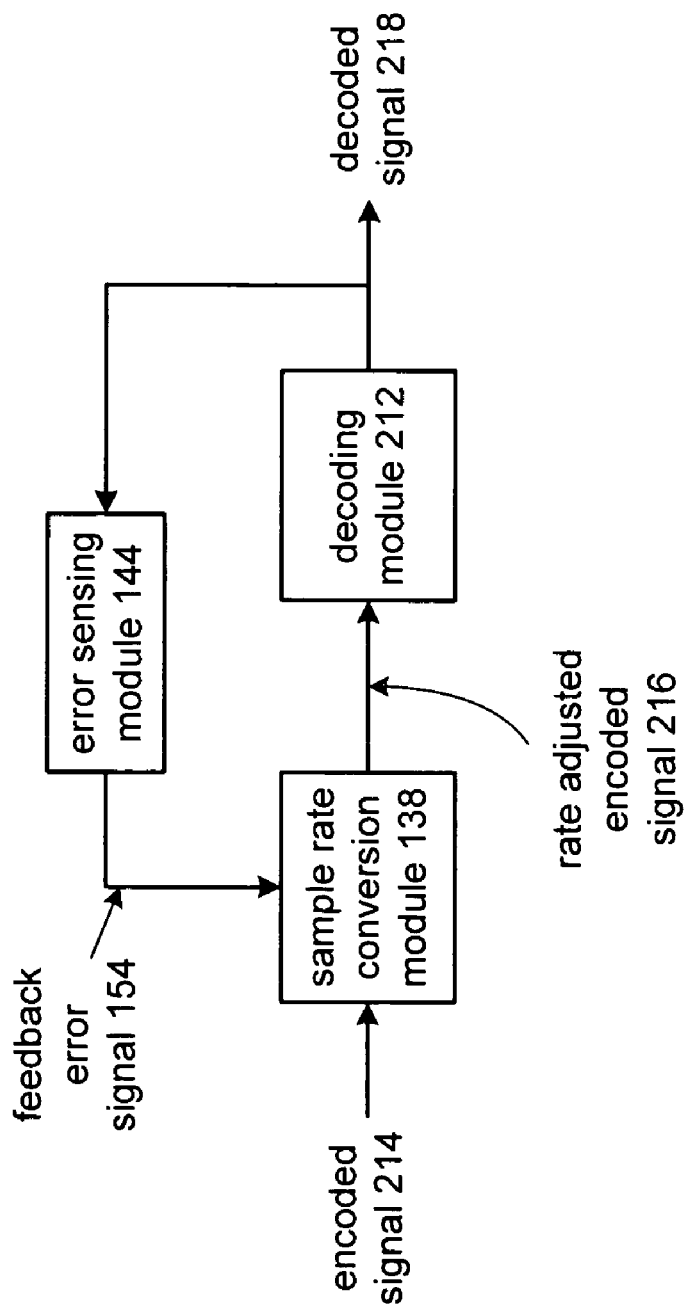
FIG. 13 is a schematic block diagram of a decoder in accordance with the present invention.

FIG. 13 is a schematic block diagram of a decoder 210 that may be utilized within the radio signal decoder integrated circuit 12 or may be a stand-alone decoder for decoding digitally encoded signals that are transmitted from a separate device. In this embodiment, the decoder 210 includes the sample rate conversion module 138, a decoding module 212, and the error sensing module 114. The sample rate conversion module 138 is operably coupled to convert, based on the error feedback signal 154, the rate of an encoded signal 214 from a first rate to a second rate to produce a rate adjusted encoded signal 216. For example, the encoded signal 214 may have a sampling rate of 400 KHz and the rate adjusted encoded signal 216 may have a sampling rate of 152 KHz or 228 KHz.

The decoding module 212 is operably coupled to decode the rate adjusted encoded signal 216 to produce a decoded signal 218. The functionality of decoding module 212 corresponds to the encoding function used to produce the encoded signal 214. Accordingly, if the encoded signal is produced by a modulation function (e.g., AM, FM, BPSK, QPSK, et cetera), the decoding modulation would be the corresponding demodulation function. Alternatively, if the encoded signal 214 was produced by an encoding function, such as scrambling, interleaving, et cetera the decoding module would have the corresponding inverse function.

The error sensing module 144 determines the error feedback signal 154 based on a difference between a known property of decoded signal 218 and the actual measured property of decoded signal 218. In one embodiment, the known property of decoded signal 218 corresponds to the period of a signal component of the decoded signal 218. This period is compared with the ideal period of that signal component to produce the error signal 154. The signal component may comprise a pilot tone and/or training sequence.

Figure 14:
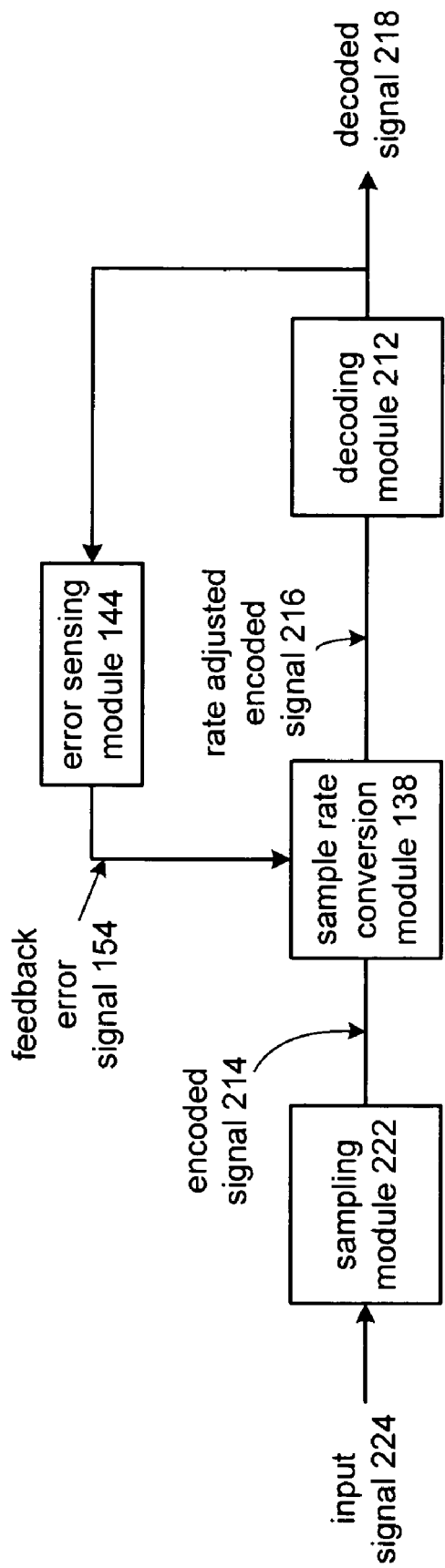
FIG. 14 is a schematic block diagram of another embodiment of a decoder in accordance with the present invention.

FIG. 14 is a schematic block diagram of another embodiment of a decoder 220, which may be used within the radio signal decoder integrated circuit 12 or as a stand-alone decoder. The decoder 220 includes a sampling module 222, the sample rate conversion module 138, the decoding module 212, and the error sensing module 144. The sample rate conversion module 138, decoding module 212 and error sensing module 144 function as previously described with reference to FIG. 13.

The sampling module 222 receives an input signal 224 and samples it at a given sampling rate to produce the encoded signal 214. The input signal 224 may be a digital signal or analog signal. If the input signal 224 is an analog signal, the sampling module 222 includes an analog-to-digital conversion function to produce the encoded signal 214 at the given sampling rate. In general, the decoder functions to receive the input signal, which is generated with respect to a first clock domain (e.g., the clock domain of the transmitter). Sampling module 222 samples the input signal with a second clock domain and the DRC coverts the samples from the rate of the second clock domain to the rate of the first cock domain. The decoding module 212 then processes the data at the rate of the first clock domain.

Figure 15:
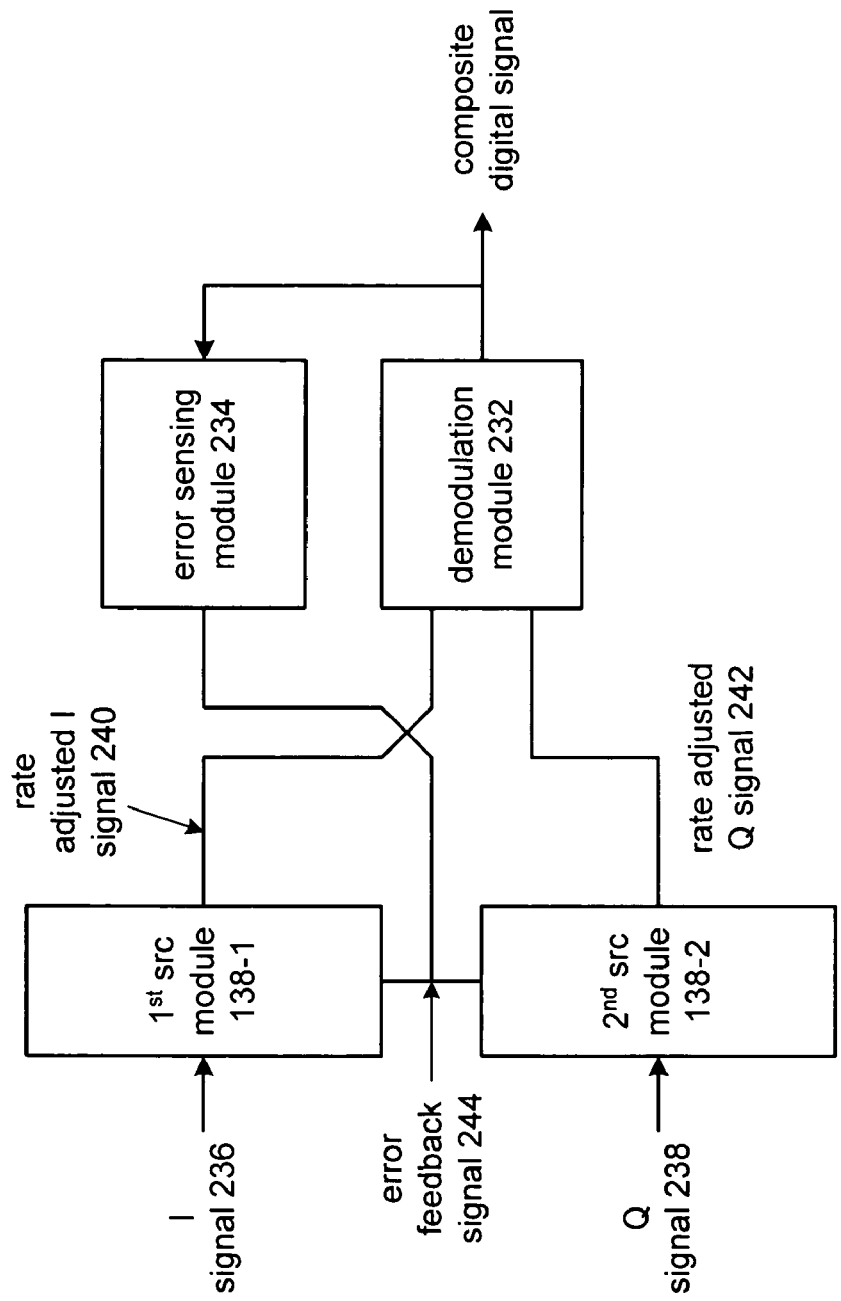
FIG. 15 is a schematic block diagram of a digital decoder in accordance with the present invention.

FIG. 15 is a schematic block diagram of another embodiment of a digital decoder 230 that may be used in the radio signal decoder integrated circuit 12, or stand-alone decoder. The digital decoder 230 includes a first sample rate conversion module 138-1, a second sample rate conversion module 138-2, a demodulation module 232, and an error sensing module 234. The first sample rate conversion module 138-1 is operably coupled to adjust the sampling rate of an in-phase (I) signal 236 to produce a rate adjusted in-phase signal 240, and/or derivative thereof, based on an error feedback signal 244. The second sample rate conversion module 138-2 is operably coupled to adjust the sampling rate of a quadrature (Q) signal 238 to produce a sample adjusted quadrature signal 242, and/or derivative thereof, based on the error feedback signal 244. As one of average skill in the art would appreciate, the in-phase and quadrature signals 236 and 238 may correspond to signal components of the digital baseband signal 152 of FIG. 8.

The demodulation module 232, which may be the demodulation module 140 of FIG. 8, demodulates the rate adjusted in-phase signal component 240 and rate adjusted quadrature signal component 242 to produce a composite digital signal. The error sensing module 234, which may correspond to the error sensing module 144 of FIG. 8, determines the error feedback signal 244 based on actual and known properties of the composite digital signal. The determination of the error feedback signal 244 may be done in accordance with the previous discussions of the functionality of error sensing module 144.

Figure 16:
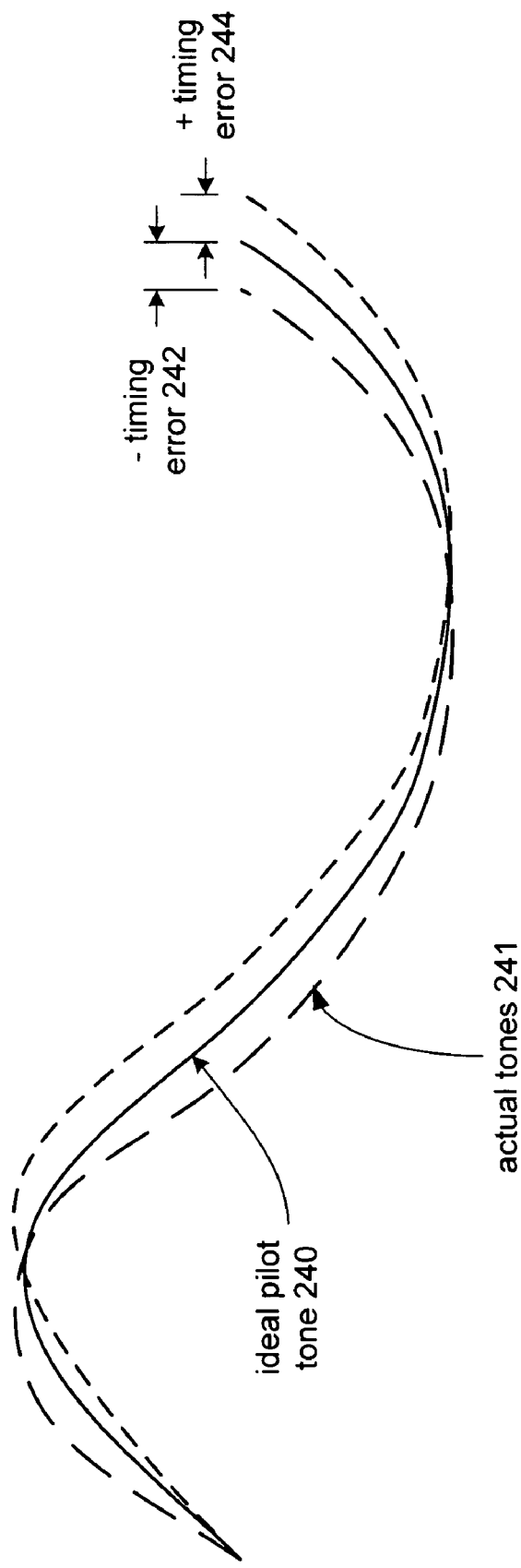
FIG. 16 is a diagram of an example of error correction in accordance with the present invention.

FIG. 16 is an example of the functionality of error correction performed by the error feedback module 144, sample rate conversion module 138 and demodulation module 140. In this illustration, an ideal pilot tone 240 is shown as a solid line while actual pilot tone measurements 241 are indicated by dash lines. The error sensing module 144 determines a plus or minus timing error 242 or 244 of the actual pilot tone signal 241 with respect to the ideal pilot tone signal 240. The feedback error signal 154 corresponds to the plus or minus timing error 242 or 244 such that the sample rate conversion module 138 adjusts the sample rate conversion based on the plus or minus timing error, thereby substantially illuminating the timing error 242 and/or 244 prior to decoding.

Figure 17:
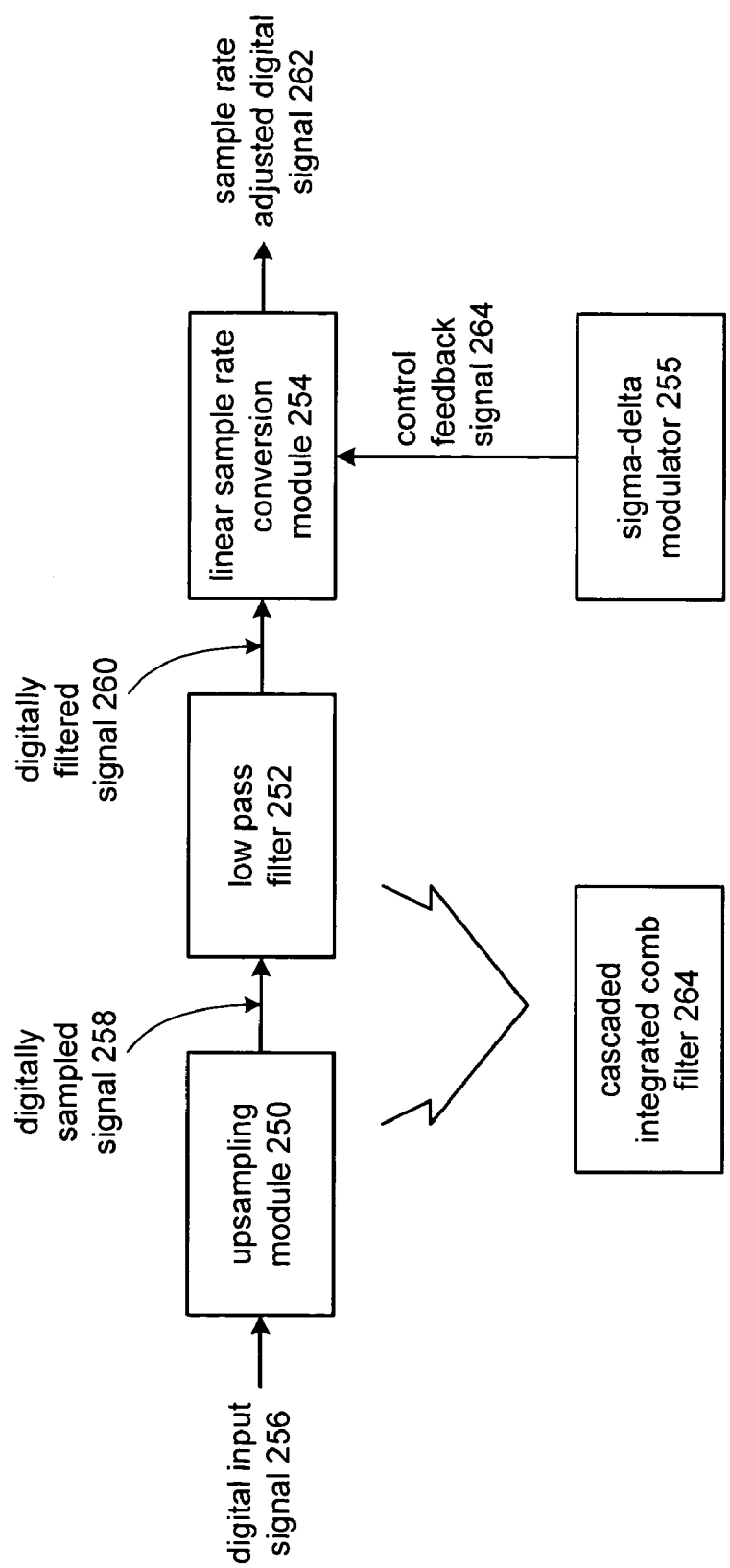
FIG. 17 is a schematic block diagram of a sample rate conversion module in accordance with the present invention.

FIG. 17 is a schematic block diagram of a sample rate conversion module 138 that includes a sampling module 250, a low pass filter 252, a linear sample rate conversion module 254, and a sigma-delta modulator 255. The sampling module 250 samples a digital input signal 256, which has a first sampling rate, to produce a digitally sampled single 258. At a minimum, the sampling module 250 over samples the digital input signal in accordance with the Nyquist rate. In one embodiment, the digital input signal may include an in-phase signal component of a baseband radio signal and a quadrature signal component of the baseband radio signal. Accordingly, the digital up-sampled signal 258 would include an up-sampled I component and an up-sampled Q component.

The low pass filter 252 filters the digital sampled signal 258 to produce a digitally filtered signal 260. Note that in one embodiment, the sampling module 250 and low pass filter 252 may be implemented via a cascaded integrated cone filter 264.

The linear sample rate conversion module 254 converts the digitally filtered signal 260 into a sample rate adjusted digital signal 262 based on a control feedback signal 264. In one embodiment, the sigma-delta modulator 255 may generate the control feedback signal 264 based on a ratio between the rate of the sample rate adjusted digital signal 262 and the rate of the digital input signal 256. As one of ordinary skill in the art will appreciate, the rate of the sample rate adjusted digital signal 262 may be greater than or less than the rate of the digital input signal 256. With such a sample rate converter, few bits are needed by using a time averaging of the sample values as opposed to using specific sample values.

In another embodiment, the linear sample rate conversion module 254 functions to pass, as a sample of the sample rate adjusted digital signal, a sample of the digitally filtered signal when, for the sample of the sample rate adjusted digital signal, the control feedback signal has a value that is within a first value range, e.g., plus or minus a given percentage of the sample rate. The linear sample rate conversion module 254 also functions to determine, as the sample of the sample rate adjusted digital signal, a sample value based on the current sample of the digitally filtered signal and a previous sample of the digitally filtered signal when, for the sample of the sample rate adjusted digital signal, the control feedback signal has a value that is outside the first value range. The first value range corresponds to the amount of difference between the digitally filtered signal in time with respect to a desired sample point of the sample rate adjusted digitally signal. For instance, the first value range may correspond to a difference of plus or minus 10%, or less.

The linear sample rate conversion module 254 may determine the sample value by multiplying the previous sample value with the value of the control feedback signal to produce a first product. The linear sample rate conversion module then subtracts the value of the control feedback signal from a maximum value of the feedback error signal to produce a complimentary error feedback signal. The linear sample rate conversion module then multiples the current sample with the complimentary error feedback signal to produce a second product. The linear sample rate conversion module then sums the first and second products to produce a sum and divides the sum by the maximum value of the feedback error signal to produce the sample value. Generally, the linear sample rate conversion module 252 is performing a linear function to determine the sample value, where the linear function may correspond to $Y=mX+b$.

As one of ordinary skill in the art will appreciate, a linear interpolator may be implemented using the linear sample rate conversion module 254 and the sigma-delta modulator 255. The linear sample rate conversion module is operably coupled to sample a digital signal in accordance with a control feedback signal. The sigma-delta modulator is operably coupled to produce the control feedback signal based on an interpolation ratio. In one embodiment, the interpolation ratio is a ratio between the input sample rate and the output sample rate of the linear interpolator.

Figure 18:
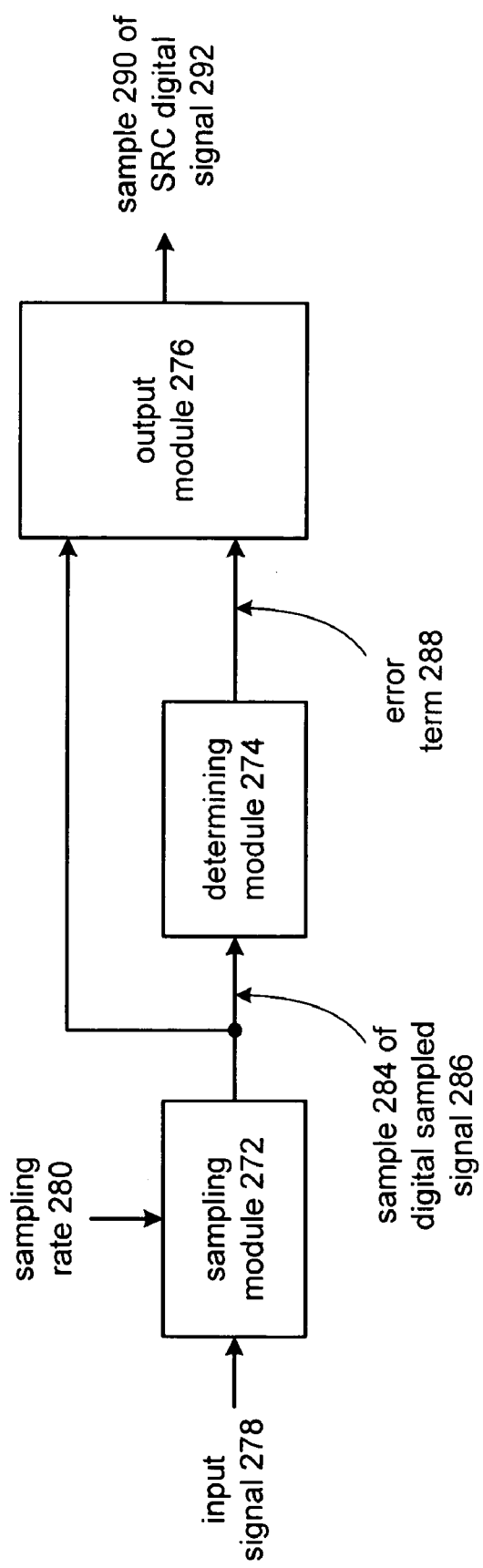
FIG. 18 is a schematic block diagram of another embodiment of a sample rate converter in accordance with the present invention.

FIG. 18 illustrates a schematic block diagram of another embodiment of a sample rate converter 170, which may be used for the sample rate converter 138 of FIG. 8. The sample rate converter 270 includes a sampling module 272, a determining module 274, and an output module 276. The sampling module 272 is operably coupled to up-sample an input signal 278 based on a sampling rate 280 to produce a sample 284 of a digital sampled signal 286. Note that in one embodiment the input signal 278 may correspond to the digital baseband signal 152 of FIG. 8. In another embodiment, the input signal 278 may be an analog signal or digital signal. Note that if the input signal 278 is a digital signal, the sampling module 272 further includes a digital low pass filter to filter the digital signal thereby producing the corresponding input signal 278. The sampling rate 280 may be any integer value to produce the digital sampled signal 286. For example, the sampling rate 280 may be any $2^N$ up-sampling rate or an integer multiple sampling rate of the rate of the input signal 278.

The determining module 274 is operably coupled to determine an error term 288 from the sample 284 of the digital sampled 286. The determining module 274 determines, for a given sample of the digital sampled signal 286, whether a sample of the digital sample signal has an error term within a first value range. The determining module 274 determines the error term based on known properties of the digital sampled signal 286 in comparison with the particular sample 284. If the particular sample 284 does not coincide with the known properties of the digital sampled signal 286, the error term 288 is generated.

The output module 276 is operably coupled to pass the sample 284 as an output sample 290 of the sample rate converted digital signal 292 when the error term 288 is within a first value range. The output module 276 is also operably coupled to determine a value for the output sample 290 of the sample rate conversion digital signal 292 from the sample 284 of the digital sampled signal 286 based on the error term 288. In one embodiment, the output module 276 determines the sample 290 from the sample 284 an error term 288 by multiplying the previous sample with the error term to produce a first product. The output module then subtracts the error term from a maximum value of the error term to produce a complimentary error term. The output module 276 then multiples the sample with the complimentary error term to produce a second product. The output module 276 then sums the first and second products to produce a sum and then divides the sum by the maximum value of the error term to produce the sample value.

Figure 19A:
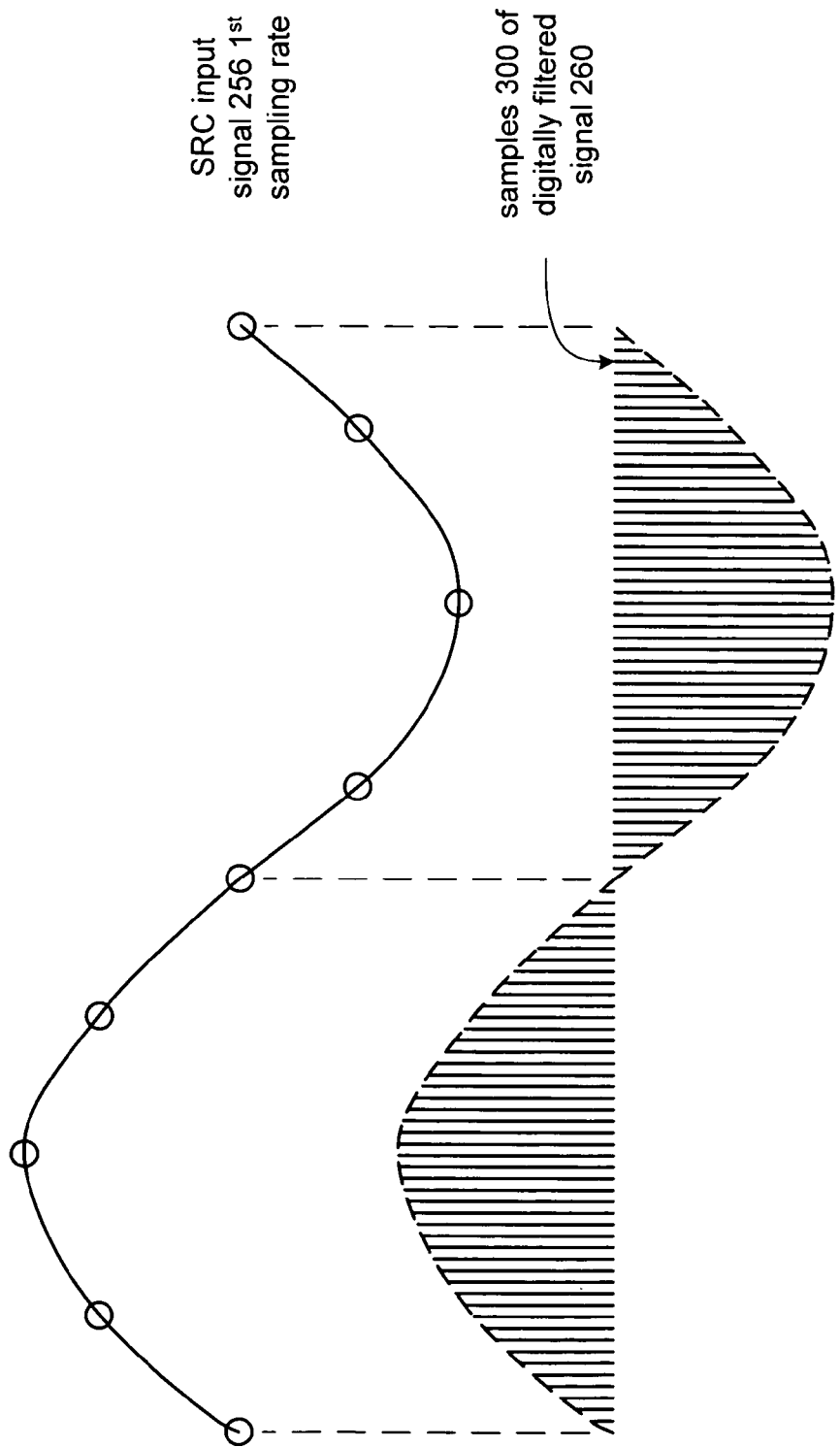
FIGS. 19A-19D illustrate an example of sample rate conversion, demodulation and error sensing in accordance with the present invention.

FIGS. 19A-19D illustrate the functionality of the sample rate converters of FIGS. 8, 17 and 18. As shown in FIG. 19A, a sample rate converter input signal 256 has a first sampling rate of eight. As such, a sinusoidal signal will have 8 sampling points per period. As is also shown in FIG. 19A, the input signal 256 is up-sampled at a particular rate (e.g., 16) to produce a plurality of samples 300 of the digitally up-sampled signal. As one of ordinary skill in the art will appreciate, the sample rate of 8 and oversampling of 16 are mere examples of numerous values that could be used.

Figure 19B:
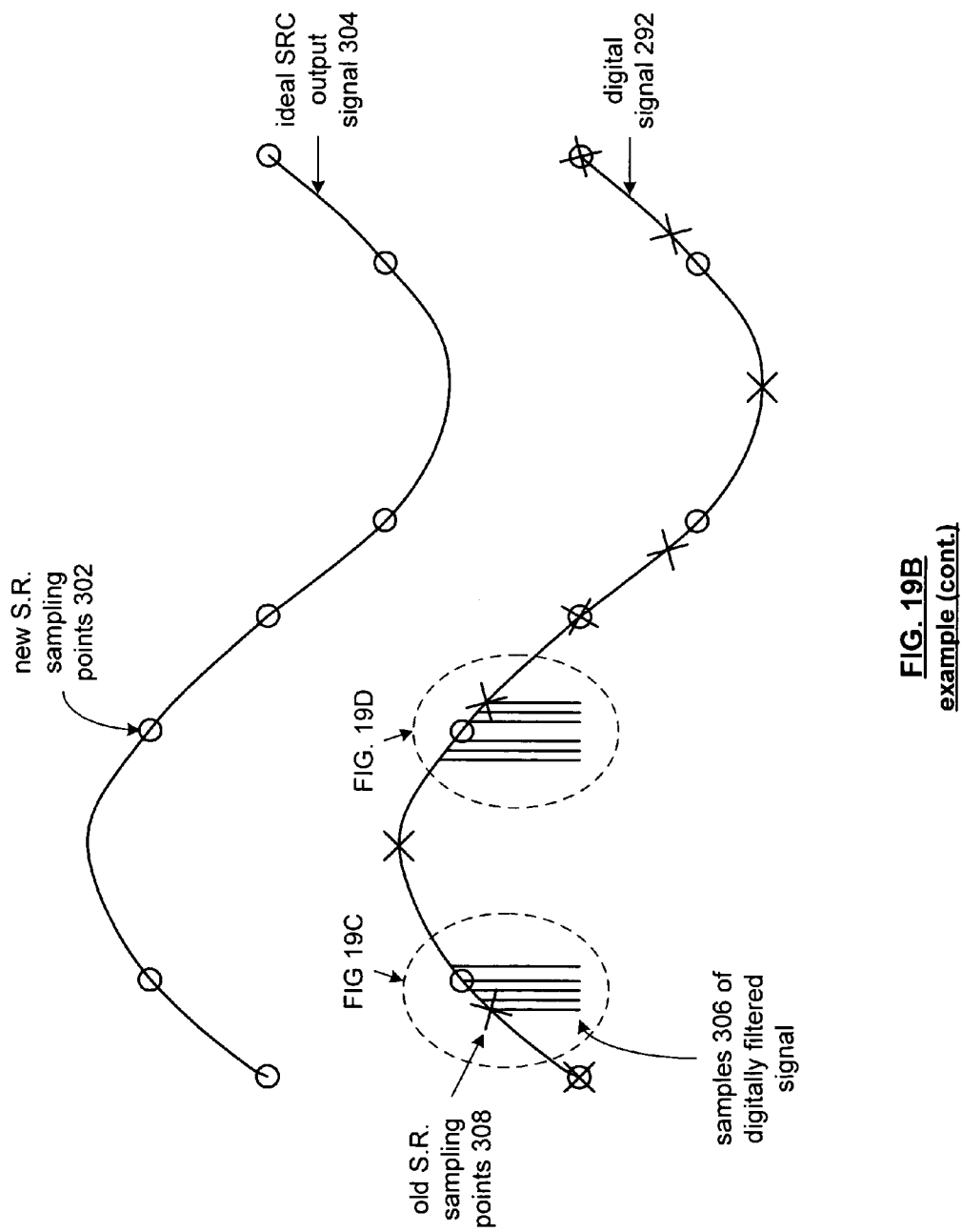

FIG. 19B illustrates the ideal sample rate converted output signal 304 where the new sample rate sampling points 302 are shown. In this example, the ideal sample rate converted output signal 304 has 6 sampling points per period. As one of ordinary skill in the art will appreciate, the sample rate of 6 is a mere example of the numerous values that could be used.

As is also shown in FIG. 19B, the old sampling rate points 308 are shown by X and the new sampling rate points 302 are shown as zeros. The samples 306 of the digitally filtered signal are shown by lines up to the magnitude of the digitally filtered signal 260. As is further shown, the details of two sample rate conversion points will be further illustrated in FIGS. 19C and 19D.

Figure 19D:
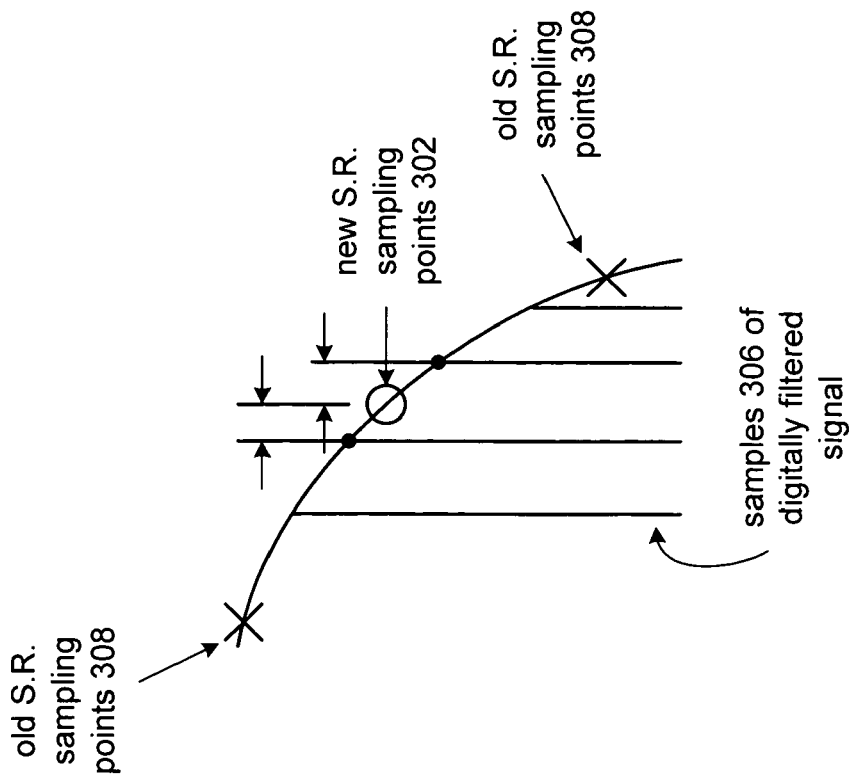
Figure 19C:
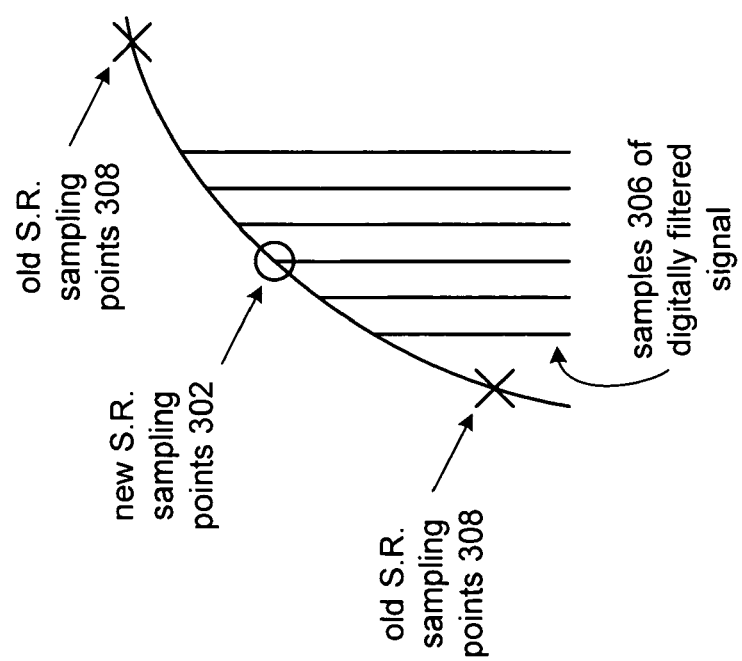

In FIG. 19C, the old sampling rate points 308 are shown to provide a border around the new sampling point 302. As is also shown, one of the samples 306 of the digital filtered signal occurs, in time, with the new sample rate sampling points 302. In this instance, the error term would be zero since the difference between the particular sample 306 and the new sample rate sampling point 302 are aligned in time. As such, the sample outputted for the ideal sample rate converted signal 304 is the sample 306.

FIG. 19D illustrates the new sampling point occurring in time, between two up-sampled points 306. In this instance, an error term is determined and, based on a linear function and the adjacent samples 306, the sample outputted for the ideal sample rate converted signal 304 is determined.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a handheld device that incorporates a radio signal decoder integrated circuit optimized interface with a digital audio processing integrated circuit. As one of average skill in the art will appreciate, other embodiments may be derived from the teaching of the present invention without deviating from the scope of the claims.

What is claimed is:

1. A sample rate converter comprising:
   an upsampling module operable to up-sample a digital input signal having a first rate to produce a digitally up-sampled signal;
   a low pass filter operably coupled to low pass filter the digitally up-sampled signal to produce a digitally filtered signal at an up-sampled rate; and
   a linear sample rate conversion module operably coupled to convert the digitally up-sampled signal into a sample rate adjusted digital signal having a second rate based on a control feedback signal and a linear function, wherein a relationship between the first rate and the second rate is a rate other than a power of two;
   wherein the linear sample rate conversion module further functions to:
      pass, as a sample of the sample rate adjusted digital signal, a sample of the digitally up-sampled signal when, for the sample of the sample rate adjusted digital signal, the control feedback signal has a value that is within a first value range; and
      determine, as the sample of the sample rate adjusted digital signal, a sample value based on a current sample of the digitally up-sampled signal and a previous sample of the digitally up-sampled signal when, for the sample of the sample rate adjusted digital signal, the control feedback signal has a value that is outside the first value range.

2. The sample rate converter of claim 1, wherein the sample value is determined by:
   multiplying the previous sample with the value of the control feedback signal to produce a first product;
   subtracting the value of the control feedback signal from a maximum value of a feedback error signal to produce a complimentary error feedback value;
   multiplying the current sample with the complimentary error feedback value to produce a second product;
   summing the first and second products to produce a sum; and
   dividing the sum by the maximum value of the feedback error signal to produce the sample value.

3. A sample rate converter comprising:
   a sampling module operably coupled to sample, at a sampling rate, an input signal to produce a digital sampled signal at the sampling rate;
   a determining module operably coupled to determine whether, for a given sample of a sample rate conversion digital signal at a second rate, a sample of the digital sampled signal has an error term within a first value range, wherein a relationship between the sampling rate and the second rate is a non-power of two; and
   an outputting module operably coupled to:
      pass the sample of the digital sampled signal as the given sample when the error term is within the first value range; and
      determine a value for the given sample based on the sample of the digital sampled signal, a previous sample of the digital sampled signal, and the error term when the error term is not within the first value range.

4. The sample rate converter of claim 3, wherein the input signal comprises an analog signal.

5. The sample rate converter of claim 3, further comprising:
the input signal including a digital signal at a first rate, wherein a relationship between the first rate and the sampling rate is an integer; and
the sampling module including a digital low pass filter to low pass filter the digital signal to produce the input signal.

6. The sample rate converter of claim 3, wherein the output module further functions to:
multiply the previous sample with the error term to produce a first product;
subtract the error term from a maximum value of the error term to produce a complimentary error term;
multiply the sample with the complimentary error term to produce a second product;
sum the first and second products to produce a sum; and
divide the sum by the maximum value of the error term to produce the sample value.

7. A digital Frequency Modulation (FM) decoder comprising:
a low noise amplifier operably coupled to amplify a received FM signal to produce an amplified FM signal;
a mixing module operably coupled to convert the amplified FM signal into a low intermediate frequency (IF) signal based on a local oscillation;
an analog to digital conversion module operably coupled to convert the low IF signal into a digital low IF signal;
a digital baseband conversion module operably coupled to convert the digital low IF signal into a digital baseband signal;
a sample rate converter operably coupled to adjust the digital baseband signal from a first rate to a second rate based on a feedback error signal to produce a digital FM encoded signal;
a demodulation module operably coupled to demodulate the digital FM encoded signal to produce a digital FM composite signal;
a channel separation module operably coupled to separate a left channel signal and a right channel signal from the digital FM composite signal; and
an error sensing module operably coupled to produce the feedback error signal based on the digital FM composite signal;
wherein the sample rate converter comprises:
an upsampling module operably coupled to up-sample a digital baseband signal having a first rate to produce a digitally up-sampled signal;
a low pass filter operably coupled to low pass filter the digitally up-sampled signal to produce a digitally filtered signal at an up-sampled rate; and
linear sample rate conversion module operably coupled to convert the digitally up-sampled signal into the digital FM encoded signal having the second rate based on a control feedback signal and a linear function, wherein a relationship between the first rate and the second rate is a non-power of two.

8. The digital FM decoder of claim 7, wherein the low pass filter and the upsampling module comprises:
a cascaded integrated comb (CIC) filter operably coupled to filter and upsample the digital baseband signal to produce the digitally upsampled digital signal.

9. The digital FM decoder of claim 7, wherein the sample rate converter further comprises:
the digital baseband signal including an in-phase signal component and a quadrature component; and
the digital FM encoded signal including a rate adjusted in-phase signal component, a rate adjusted derivative in-phase signal component, a rate adjusted quadrature signal component, and a rate adjusted derivative quadrature signal component.

10. The digital FM decoder of claim 7, wherein the linear sample rate conversion module further functions to:
pass, as a sample of the digital FM encoded signal, a sample of the digitally up-sampled signal when, for the sample of the sample rate adjusted digital signal, the control feedback signal has a value that is within a first value range; and
determine, as the sample of the digital FM encoded signal, a sample value based on a current sample of the digitally up-sampled signal and a previous sample of the digitally up-sampled signal when, for the sample of the sample rate adjusted digital signal, the control feedback signal has a value that is outside the first value range.

11. The digital FM decoder of claim 10, wherein the sample value is determined by:
multiplying the previous sample with the value of the control feedback signal to produce a first product;
subtracting the value of the control feedback signal from a maximum value of the feedback error signal to produce a complimentary error feedback value;
multiplying the current sample with the complimentary error feedback value to produce a second product;
summing the first and second products to produce a sum; and
dividing the sum by the maximum value of the feedback error signal to produce the sample value.

12. A digital Frequency Modulation (FM) decoder comprising:
a low noise amplifier operably coupled to amplify a received FM signal to produce an amplified FM signal;
a mixing module operably coupled to convert the amplified FM signal into a low intermediate frequency (IF) signal based on a local oscillation;
an analog to digital conversion module operably coupled to convert the low IF signal into a digital low IF signal;
a digital baseband conversion module operably coupled to convert the digital low IF signal into a digital baseband signal;
a sample rate converter operably coupled to adjust the digital baseband signal from a first rate to a second rate based on a feedback error signal to produce a digital FM encoded signal;
a demodulation module operably coupled to demodulate the digital FM encoded signal to produce a digital FM composite signal;
a channel separation module operably coupled to separate a left channel signal and a right channel signal from the digital FM composite signal; and
an error sensing module operably coupled to produce the feedback error signal based on the digital FM composite signal;
wherein the sample rate converter comprises:
a sampling module operably coupled to sample, at a sampling rate, the digital baseband signal to produce a digital sampled signal at the sampling rate;
a determining module operably coupled to determine whether, for a given sample of the digital FM encoded signal, a sample of the digital sampled signal has an error term of the feedback error signal within a first value range, wherein a relationship between the sampling rate and the second rate is a non-power of two; and an outputting module operably coupled to:
pass the sample of the digital sampled signal as the given sample when the error term is within the first value range; and
determine a value for the given sample based on the sample of the digital sampled signal, a previous sample of the digital sampled signal, and the error term.

13. The digital FM decoder of claim 12, wherein the sampling module comprises:
a digital low pass filter to low pass filter the digital baseband signal prior to up-sampling the digital baseband signal.

14. The digital FM decoder of claim 12, wherein the output module further functions to:
multiply the previous sample with the error term to produce a first product;
subtract the error term from a maximum value of the error term to produce a complimentary error term;
multiply the sample with the complimentary error term to produce a second product;
sum the first and second products to produce a sum; and
divide the sum by the maximum value of the error term to produce the sample value.

15. A sample rate converter comprising:
a sampling module operably coupled to sample a digital input signal having a first rate to produce a sampled digital signal having a second rate;
a low pass filter operably coupled to filter the sampled digital signal to produce a filtered digital signal;
a linear sample rate conversion module operably coupled to sample the filtered digital signal in accordance with a control feedback signal to produce a sample rate adjusted digital signal having a third rate; and
a sigma-delta modulator operably coupled to produce the control feedback signal based on the first and third rates;
wherein the linear sample rate conversion module further functions to:
pass, as a sample of the sample rate adjusted digital signal, a sample of the digitally up-sampled signal when, for the sample of the sample rate adjusted digital signal, the control feedback signal has a value that is within a first value range; and
determine, as the sample of the sample rate adjusted digital signal, a sample value based on a current sample of the digitally up-sampled signal and a previous sample of the digitally up-sampled signal when, for the sample of the sample rate adjusted digital signal, the control feedback signal has a value that is outside the first value range.

16. The sample rate converter of claim 15, wherein the sample value is determined by:
multiplying the previous sample with the value of the control feedback signal to produce a first product;
subtracting the value of the control feedback signal from a maximum value of a feedback error signal to produce a complimentary error feedback value;
multiplying the current sample with the complimentary error feedback value to produce a second product;
summing the first and second products to produce a sum; and
dividing the sum by the maximum value of the feedback error signal to produce the sample value.

17. A linear interpolator comprising:
a linear sample rate conversion module operable to sample a digital signal in accordance with a control feedback signal; and
a sigma-delta modulator operably coupled to produce the control feedback signal based on an interpolation ratio that is based on an input data rate and an output data rate;
wherein the linear sample rate conversion module further functions to:
pass, as a sample of a sample rate adjusted digital signal, a sample of a digitally up-sampled signal when, for the sample of the sample rate adjusted digital signal, the control feedback signal has a value that is within a first value range; and
determine, as the sample of the sample rate adjusted digital signal, a sample value based on a current sample of the digitally up sampled signal and a previous sample of the digitally up-sampled signal when, for the sample of the sample rate adjusted digital signal, the control feedback signal has a value that is outside the first value range.

18. The linear interpolator of claim 17, wherein the sample value is determined by:
multiplying the previous sample with the value of the control feedback signal to produce a first product;
subtracting the value of the control feedback signal from a maximum value of a feedback error signal to produce a complimentary error feedback value;
multiplying the current sample with the complimentary error feedback value to produce a second product;
summing the first and second products to produce a sum; and
dividing the sum by the maximum value of the feedback error signal to produce the sample value.

* * * * *